United States Patent
Matsumoto

(10) Patent No.: US 12,436,291 B2
(45) Date of Patent: Oct. 7, 2025

(54) SENSOR CHIP, ELECTRONIC APPARATUS, AND DISTANCE MEASUREMENT APPARATUS

(71) Applicant: SONY SEMICONDUCTOR SOLUTIONS CORPORATION, Kanagawa (JP)

(72) Inventor: Akira Matsumoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 910 days.

(21) Appl. No.: 17/310,999

(22) PCT Filed: Feb. 7, 2020

(86) PCT No.: PCT/JP2020/004788
§ 371 (c)(1),
(2) Date: Sep. 3, 2021

(87) PCT Pub. No.: WO2020/189082
PCT Pub. Date: Sep. 24, 2020

(65) Prior Publication Data
US 2022/0163674 A1    May 26, 2022

(30) Foreign Application Priority Data
Mar. 19, 2019 (JP) .................... 2019-050885

(51) Int. Cl.
G01S 17/93    (2020.01)
G01S 7/481    (2006.01)
(Continued)

(52) U.S. Cl.
CPC .......... *G01S 17/931* (2020.01); *G01S 7/4816* (2013.01); *H10F 30/225* (2025.01)

(58) Field of Classification Search
None
See application file for complete search history.

(56) References Cited

U.S. PATENT DOCUMENTS

2006/0145056 A1    7/2006  Jung
2007/0002446 A1    1/2007  Takeuchi
(Continued)

FOREIGN PATENT DOCUMENTS

CN    1822378 A    8/2006
CN    101253362 A   8/2008
(Continued)

OTHER PUBLICATIONS

International Search Report and Written Opinion of PCT Application No. PCT/JP2020/004788, issued on Apr. 14, 2020, 10 pages of ISRWO.

(Continued)

*Primary Examiner* — Hovhannes Baghdasaryan
(74) *Attorney, Agent, or Firm* — CHIP LAW GROUP

(57) ABSTRACT

A sensor chip according to an embodiment of the present disclosure includes a pixel. The pixel includes a photoelectric converter, a light reflector, and a light collector. The photoelectric converter includes a light entering surface which light enters and a multiplication region in which avalanche multiplication of carriers is caused by a high electric-field region. The light reflector is provided to oppose a surface, of the photoelectric converter, on an opposite side to the light entering surface. The light collector is provided between the photoelectric converter and the light reflector.

16 Claims, 16 Drawing Sheets

(51) Int. Cl.
  *G01S 17/931*    (2020.01)
  *H10F 30/225*    (2025.01)

(56) References Cited

U.S. PATENT DOCUMENTS

| | | |
|---|---|---|
| 2007/0278604 A1 | 12/2007 | Minixhofer |
| 2011/0303999 A1 | 12/2011 | Sakamoto et al. |
| 2019/0006399 A1 | 1/2019 | Otake et al. |
| 2019/0252442 A1 | 8/2019 | Tanaka et al. |

FOREIGN PATENT DOCUMENTS

| | | |
|---|---|---|
| CN | 102334197 A | 1/2012 |
| CN | 108475689 A | 8/2018 |
| CN | 109643722 A | 4/2019 |
| DE | 102012001070 A1 | 7/2012 |
| DE | 112017005264 T | 8/2019 |
| EP | 2403011 A1 | 1/2012 |
| EP | 3387676 A1 | 10/2018 |
| EP | 3549169 A1 | 10/2019 |
| JP | 2001042175 A | 2/2001 |
| JP | 2010-226071 A | 10/2010 |
| JP | 2014-027178 A | 2/2014 |
| JP | 2017-097072 A | 6/2017 |
| JP | 2018059898 A | 4/2018 |
| JP | 2018-088488 A | 6/2018 |
| JP | 2018-201005 A | 12/2018 |
| KR | 10-2006-0077567 A | 7/2006 |
| KR | 10-2011-0136786 A | 12/2011 |
| KR | 20120059444 A | 6/2012 |
| KR | 10-2019-0067127 A | 6/2019 |
| TW | 201101522 A | 1/2011 |
| WO | 2010/098224 A1 | 9/2010 |
| WO | 2018/074530 A1 | 4/2018 |
| WO | 2018/101033 A1 | 6/2018 |

OTHER PUBLICATIONS

Notification of Refusal cited in Korean Application No. 10-2021-7029044, mailed Oct. 17, 2024.
Notice to Grant Patent cited in Chinese Application No. 202080012573.X, mailed Nov. 14, 2024.

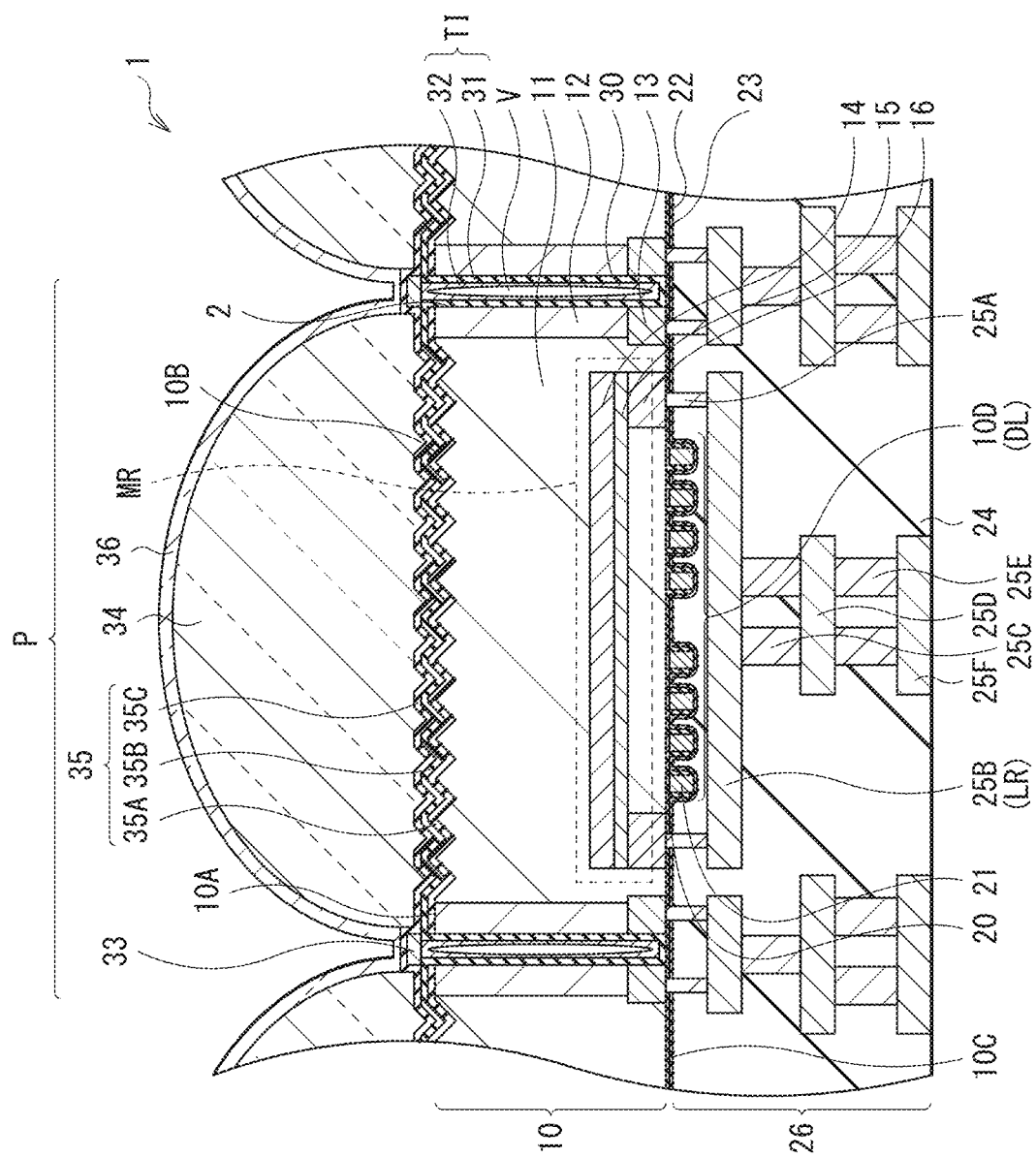
[FIG. 1]

[FIG. 2]
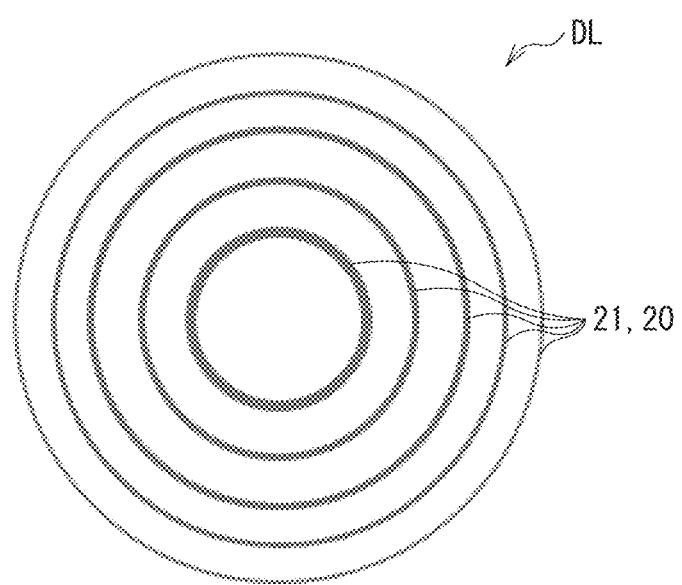

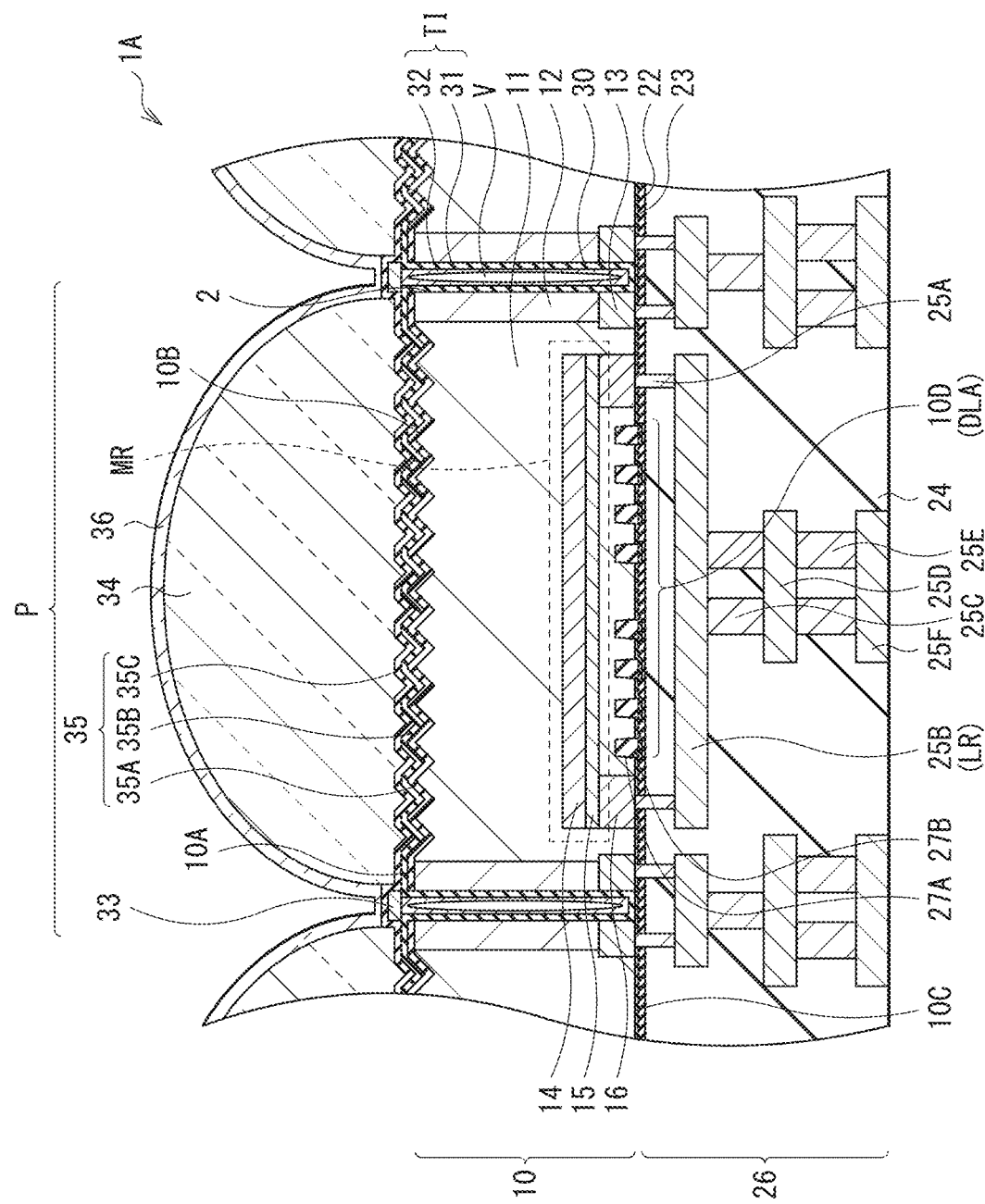

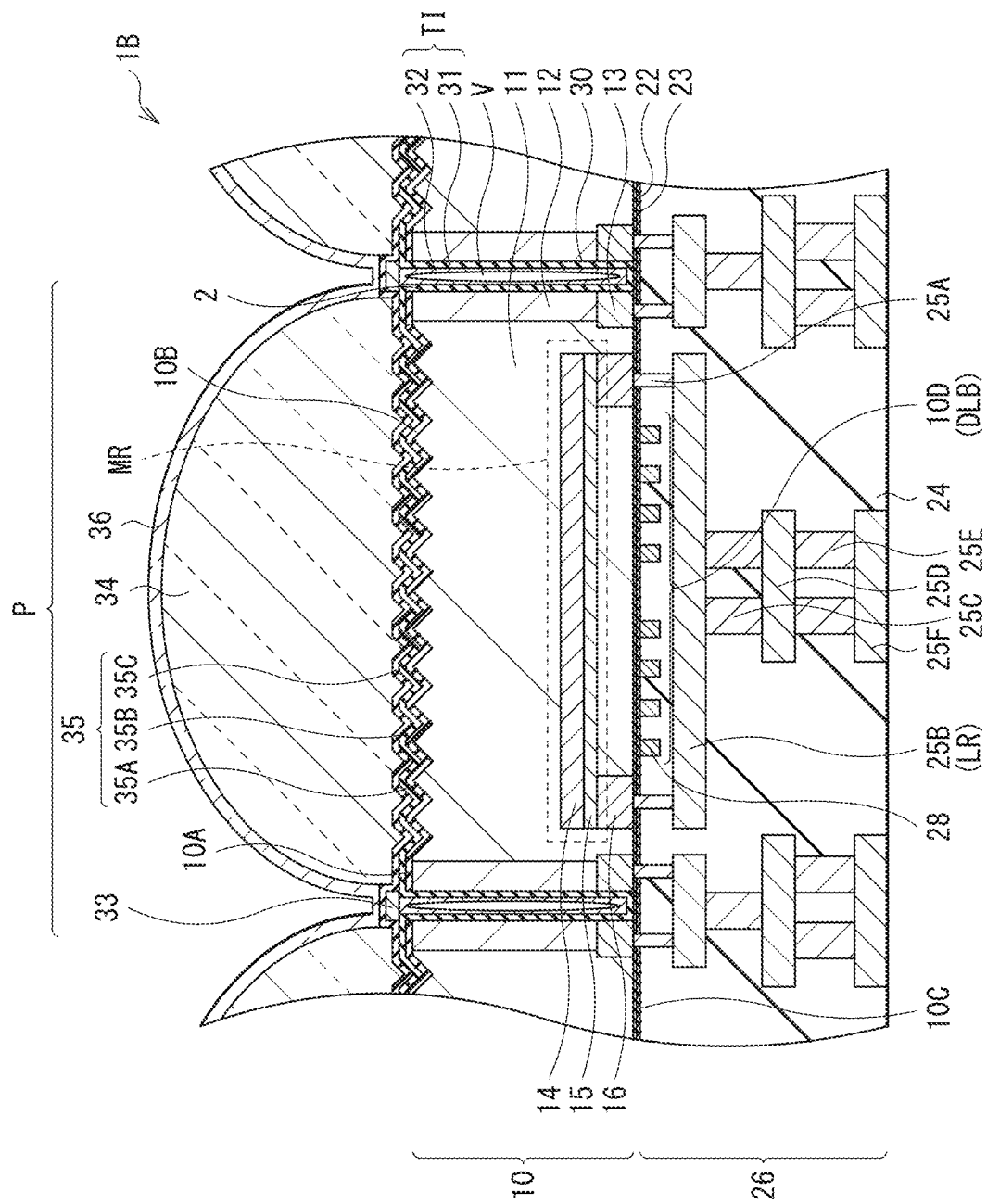
[FIG. 4]

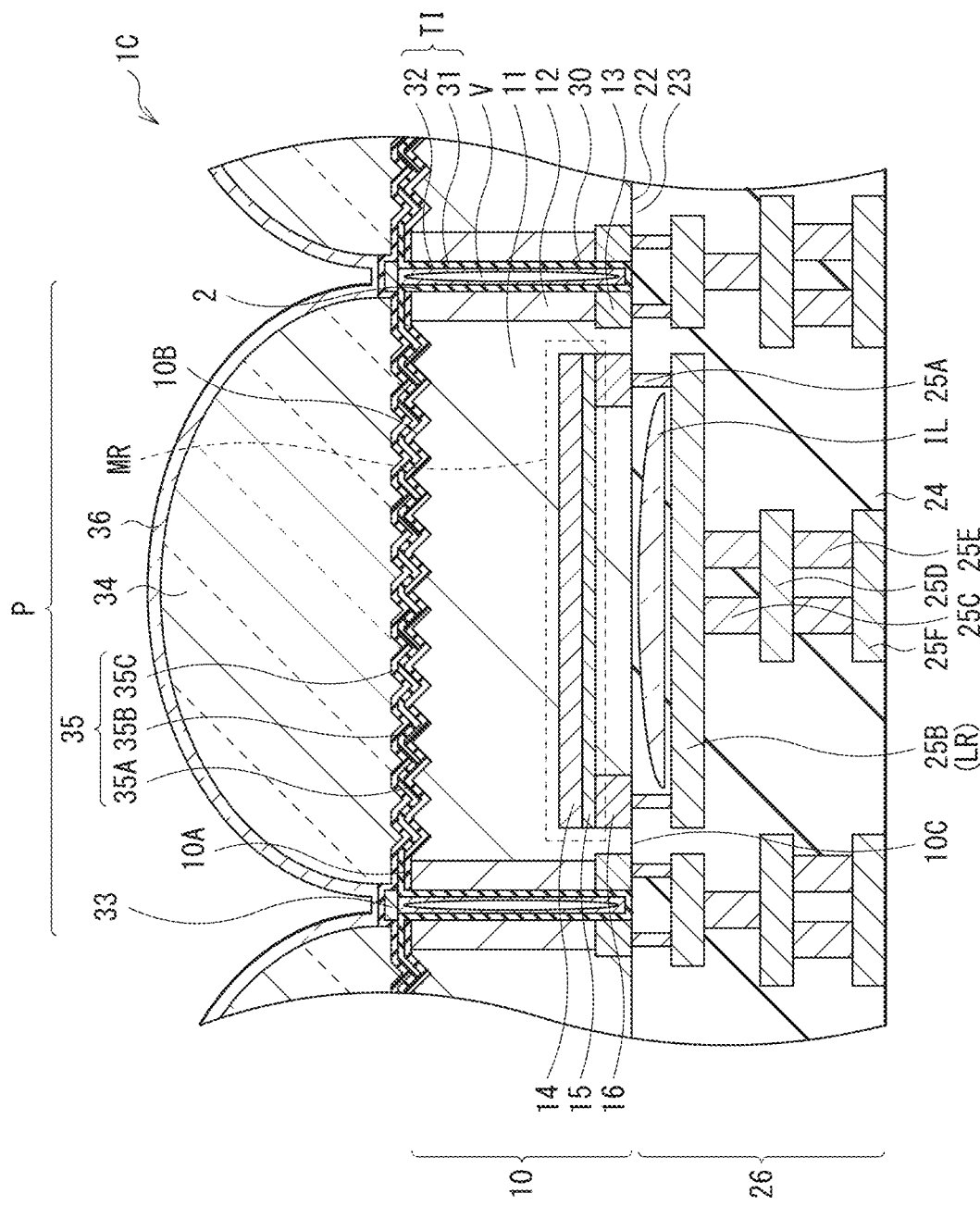
[FIG. 5]

[FIG. 6]
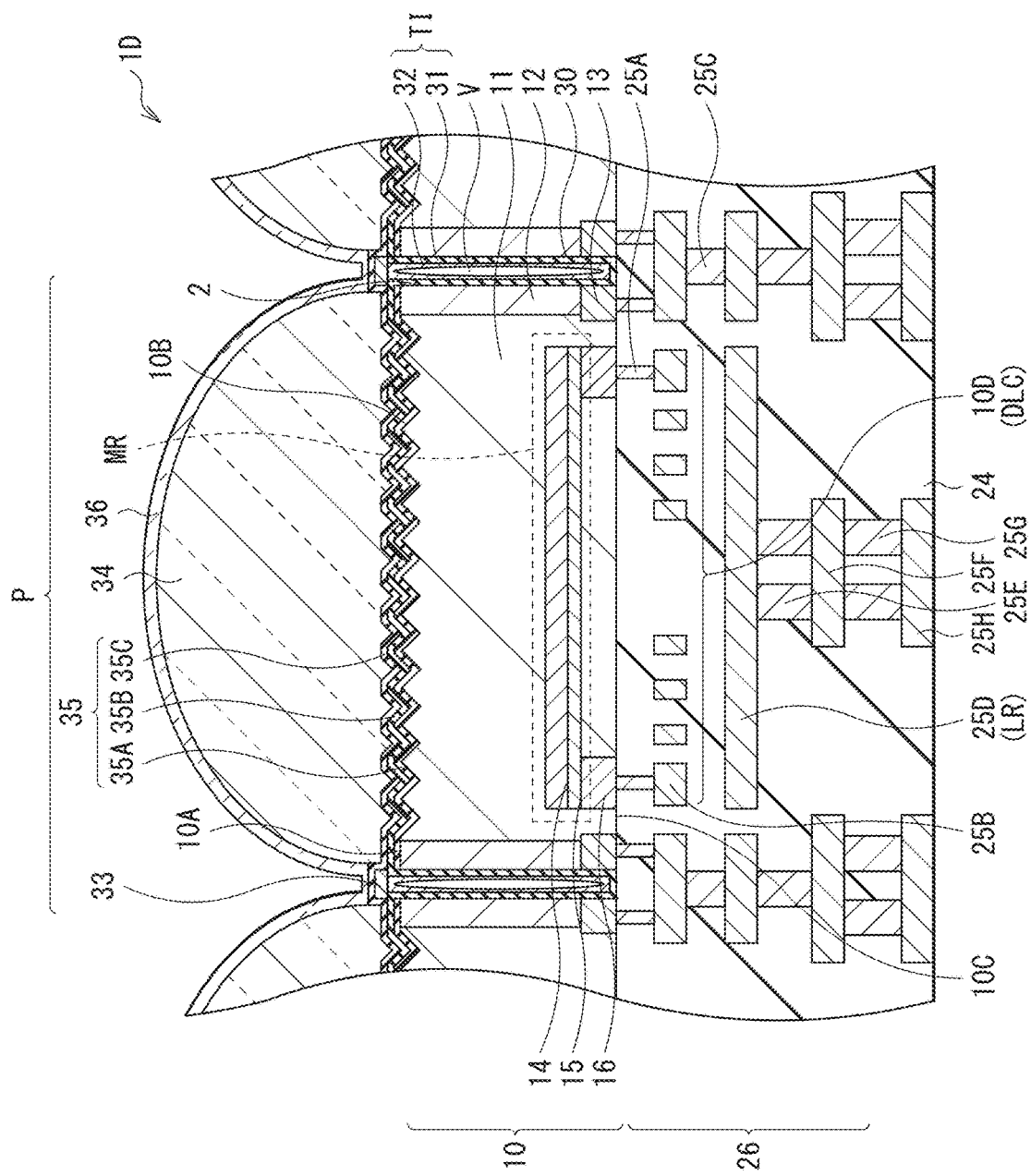

[FIG. 7]
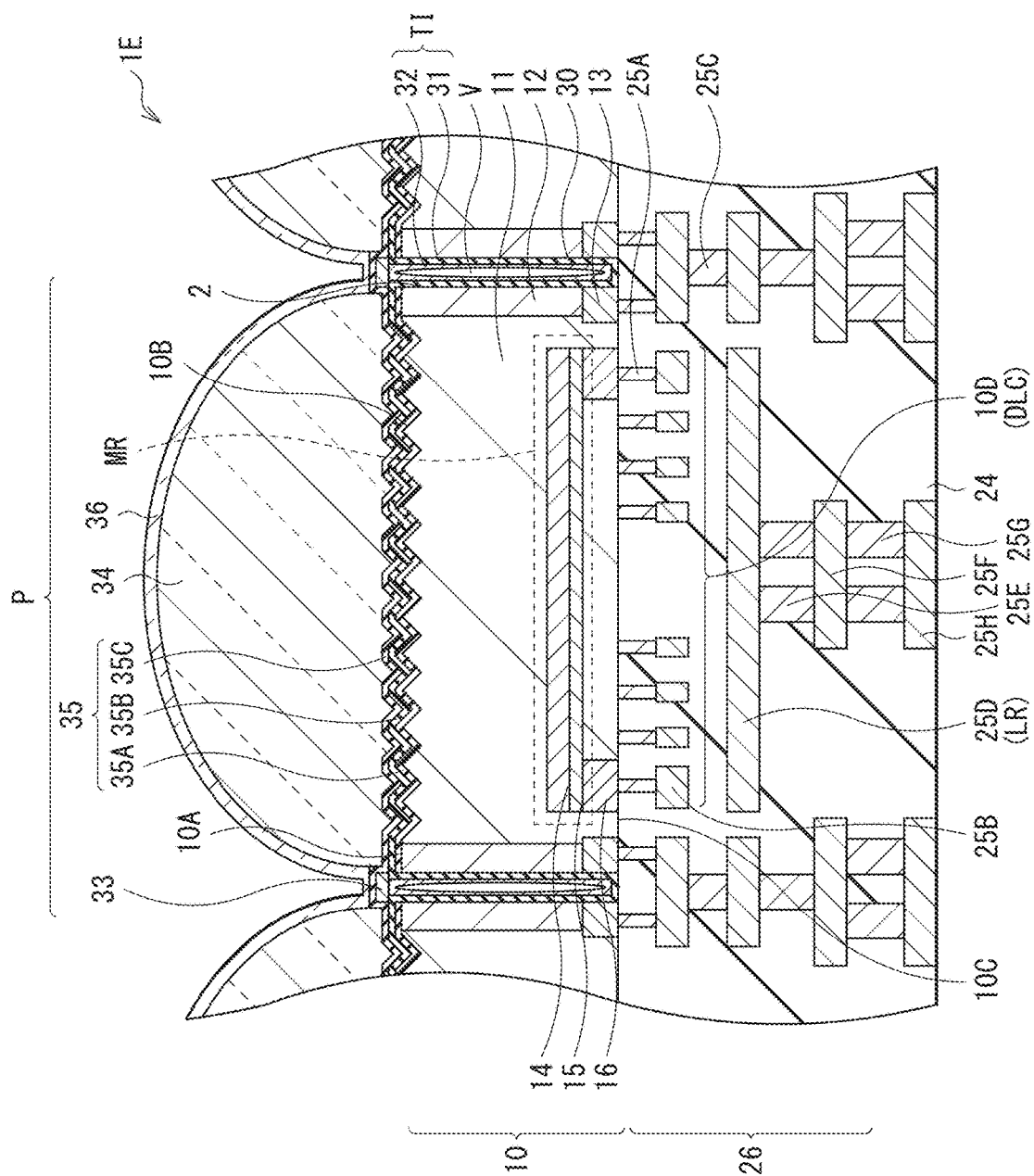

[FIG. 8]
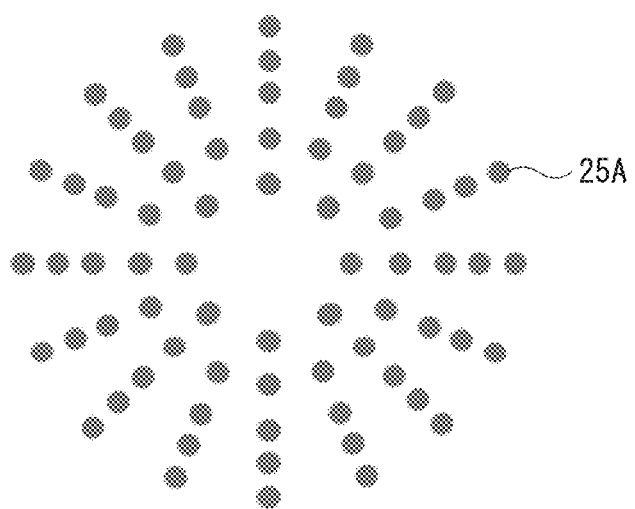

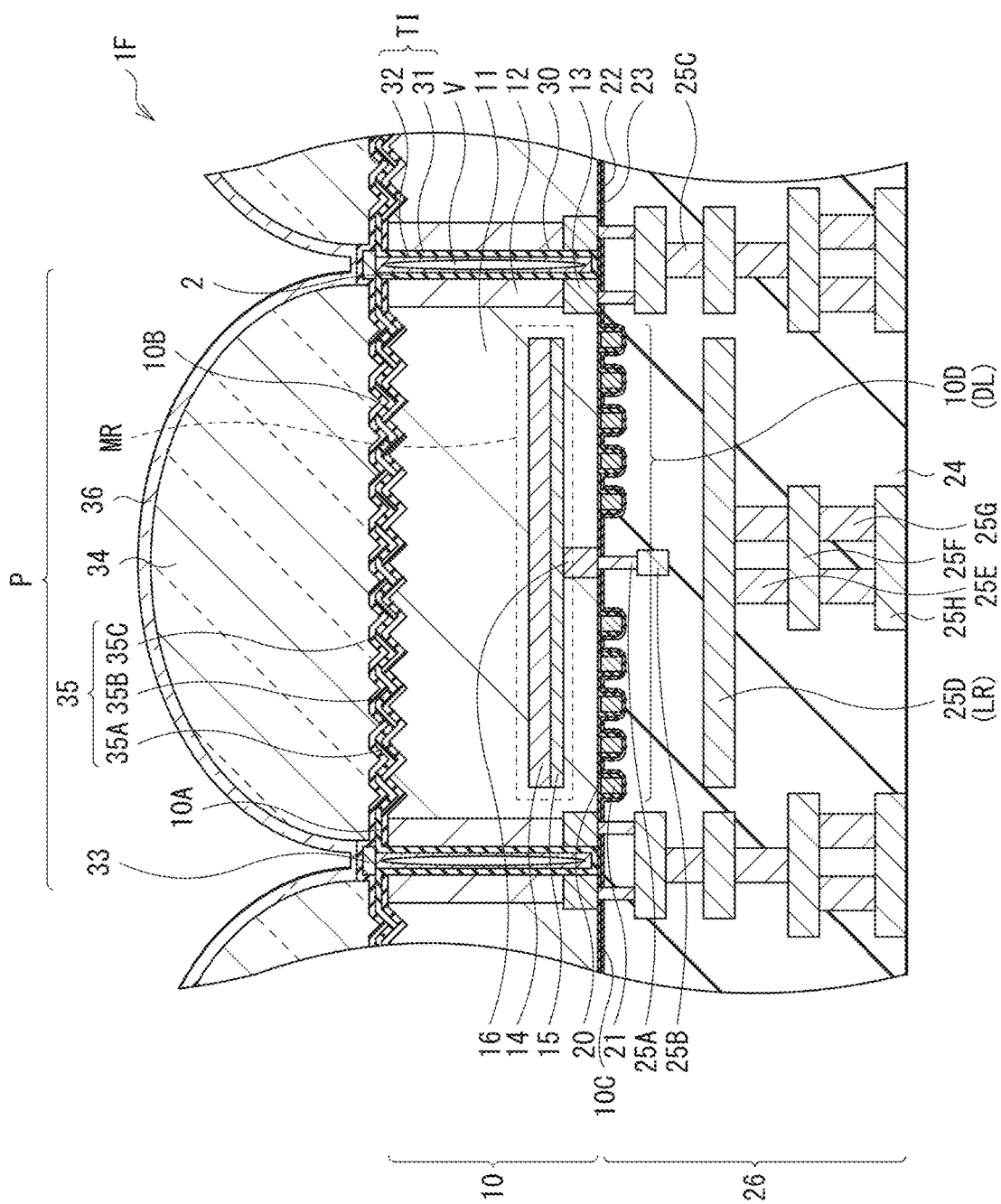
[FIG. 9]

[FIG. 10]
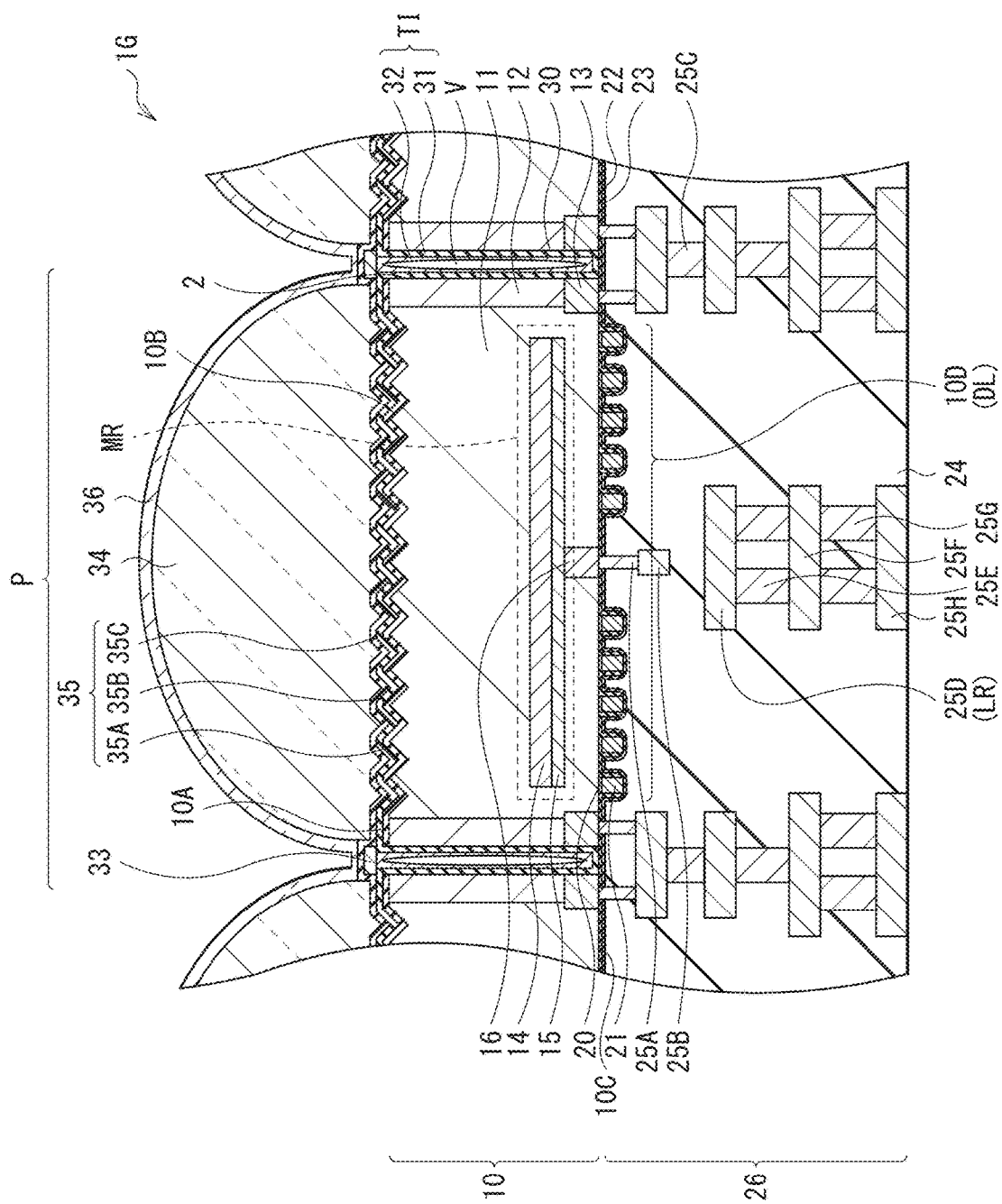

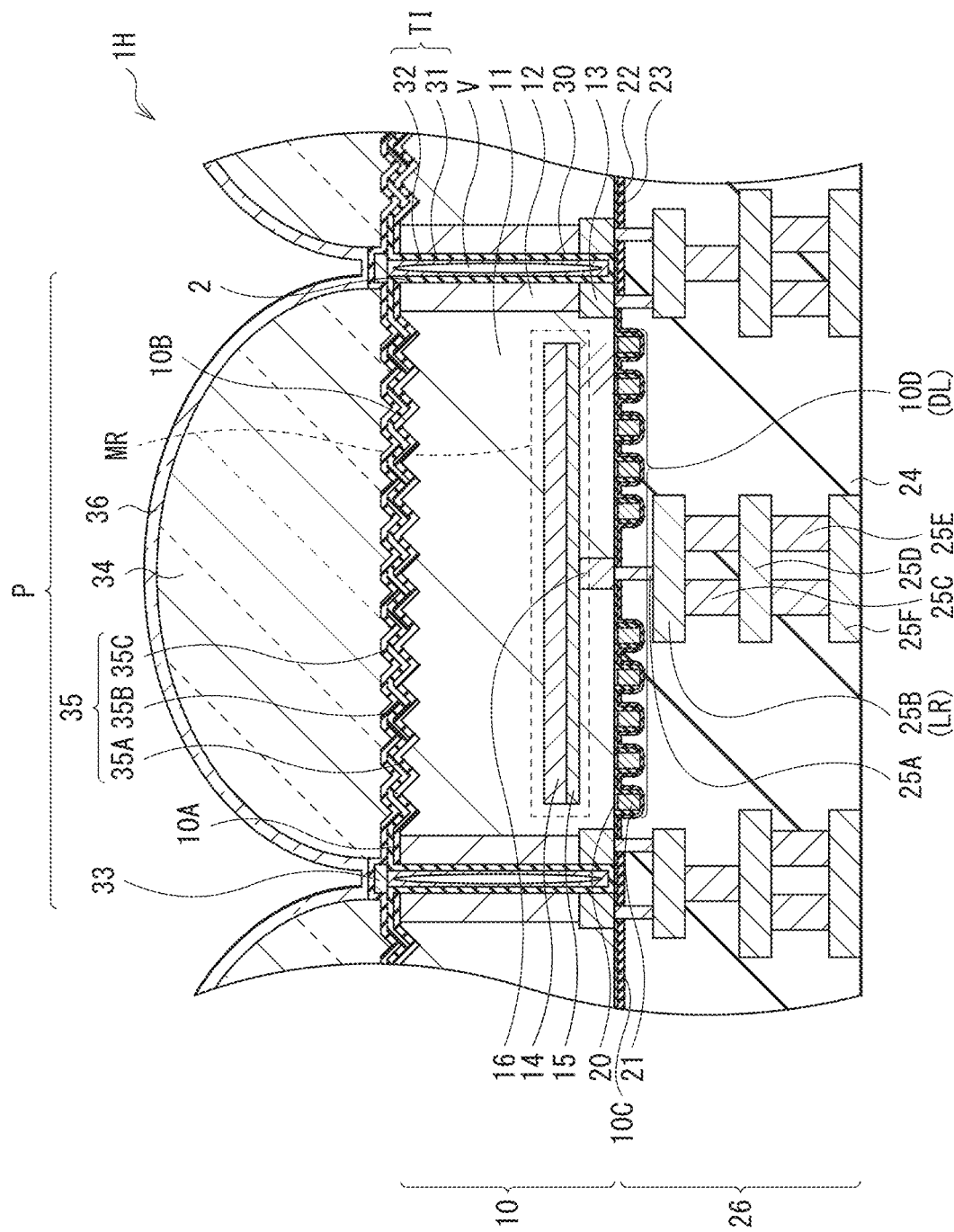
[FIG. 11]

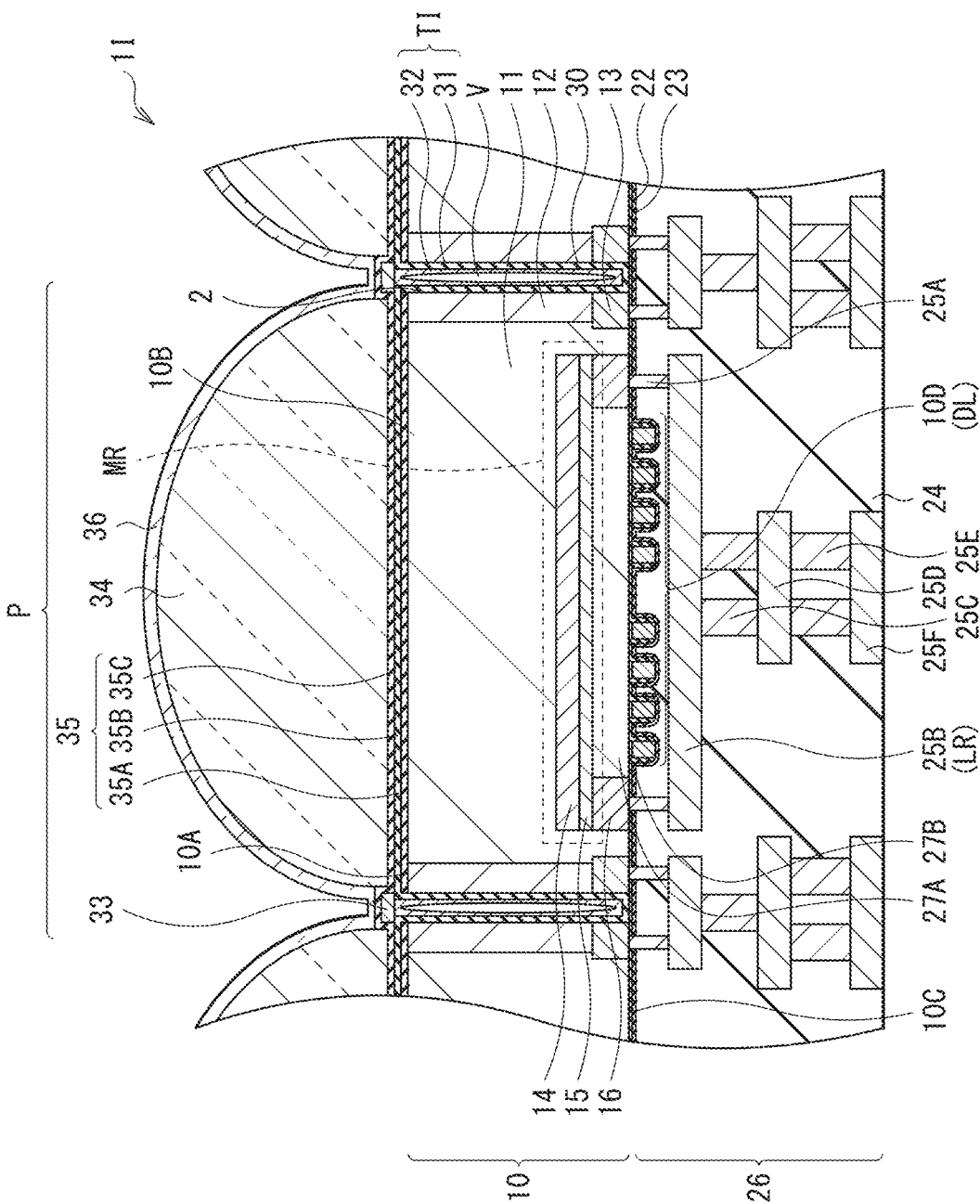

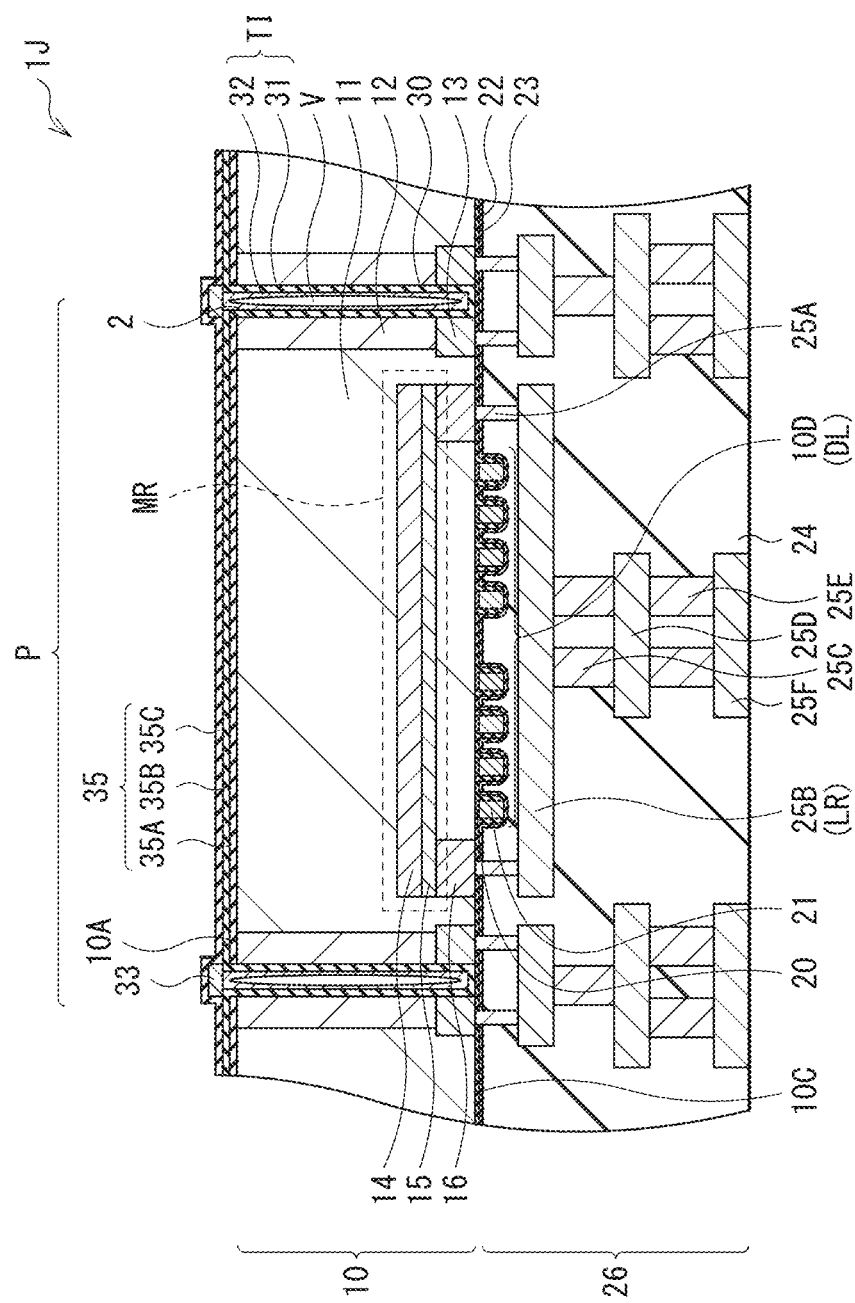
[FIG. 13]

[FIG. 14]
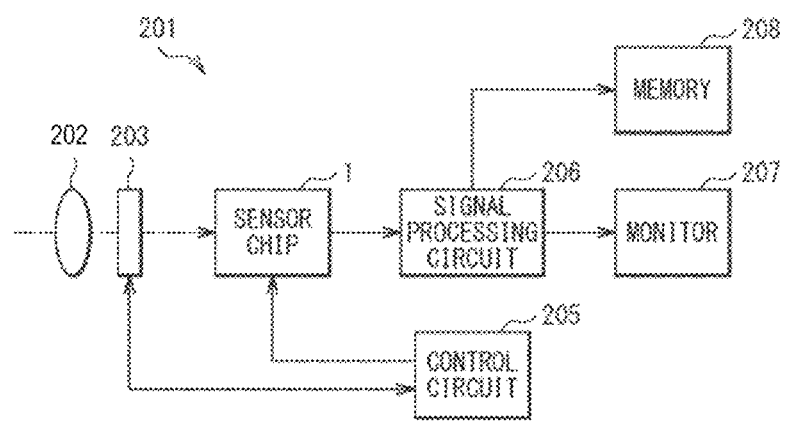

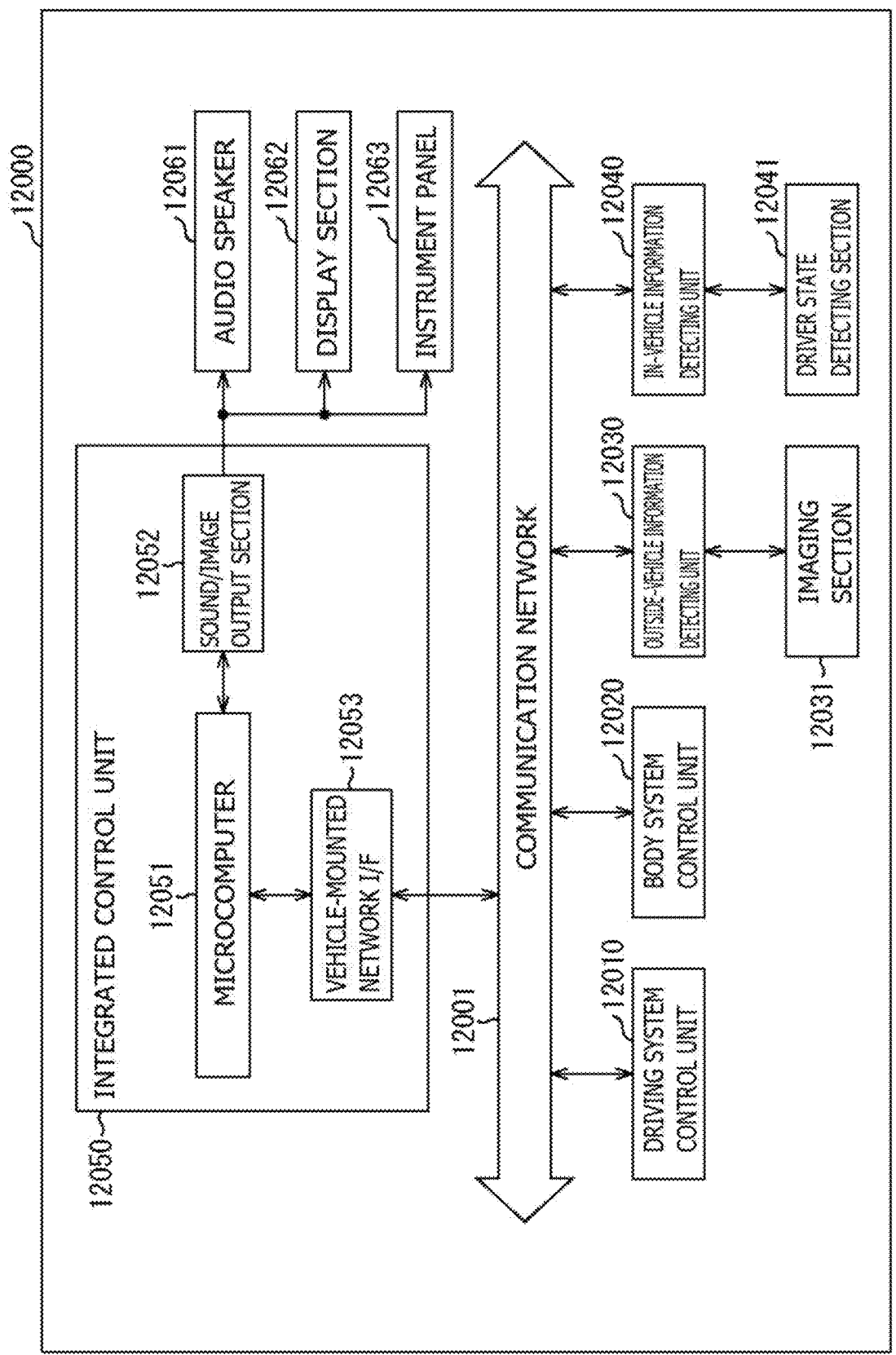
[FIG. 15]

[FIG. 16]
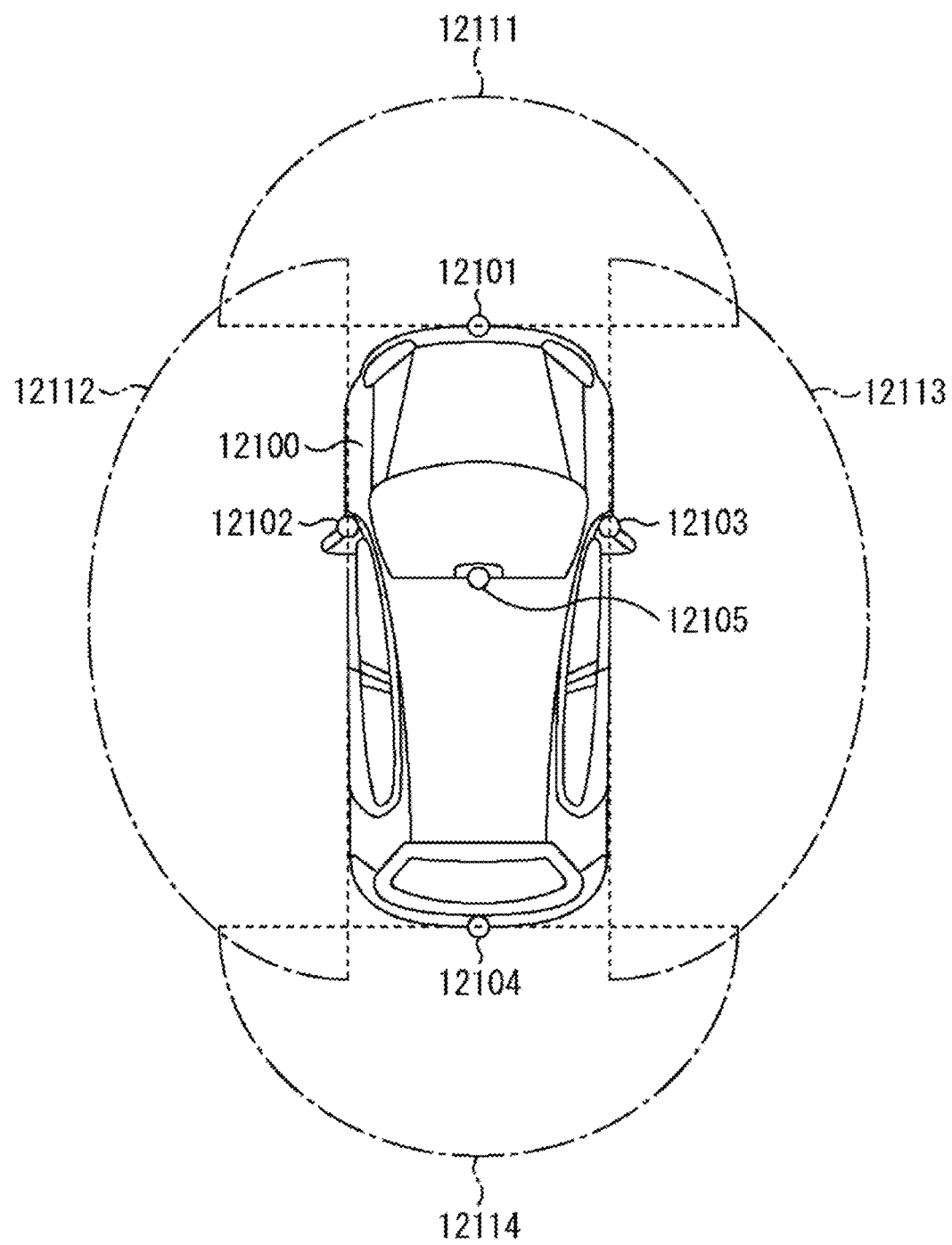

SENSOR CHIP, ELECTRONIC APPARATUS, AND DISTANCE MEASUREMENT APPARATUS

CROSS REFERENCE TO RELATED APPLICATIONS

This application is a U.S. National Phase of International Patent Application No. PCT/JP2020/004788 filed on Feb. 7, 2020, which claims priority benefit of Japanese Patent Application No. JP 2019-050885 filed in the Japan Patent Office on Mar. 19, 2019. Each of the above-referenced applications is hereby incorporated herein by reference in its entirety.

TECHNICAL FIELD

The present disclosure relates to a sensor chip having, for example, an avalanche photodiode, an electronic apparatus including the same, and a distant measurement apparatus.

BACKGROUND ART

An avalanche photodiode (APD; Avalanche Photodiode) is a photodiode in which a high electric-field region is provided in a depletion layer that spreads as a result of application of a predetermined reverse voltage to a p-n junction. Formation of a high electric-field region allows for occurrence of avalanche multiplication (avalanche breakdown) which involves a repetitive process in which carriers (electrons) generated by a photoelectric effect are accelerated by an electric field and cause impact ionization.

The APD can be driven in a linear mode in which it is driven near a breakdown voltage and can be also driven in a Geiger mode in which it is driven with a voltage higher than the breakdown voltage. The APD of the Geiger mode is also referred to as a single photon avalanche diode (SPAD; Single Photon Avalanche Diode), and is able to detect a single photon entering the photodiode.

PTL 1 discloses a sensor chip in which pixels including avalanche photodiodes are disposed in an array.

CITATION LIST

Patent Literature

PTL 1: Japanese Unexamined Patent Application Publication No. 2018-88488

SUMMARY OF THE INVENTION

Regarding a sensor including an SPAD, it is desired to improve PDE (Photon Detection Efficiency).

It is desirable to provide a sensor chip that includes an SPAD and allows for improvement in PDE, an electronic apparatus that includes such a sensor chip, and a distance measurement apparatus that includes such a sensor chip.

A sensor chip according to an embodiment of the present disclosure includes a pixel including a photoelectric converter, a light reflector, and a light collector. The photoelectric converter includes a light entering surface which light enters and a multiplication region in which avalanche multiplication of carriers is caused by a high electric-field region. The light reflector is provided to oppose a surface, of the photoelectric converter, on an opposite side to the light entering surface. The light collector is provided between the photoelectric converter and the light reflector.

An electronic apparatus according to an embodiment of the present disclosure includes an optical system, a sensor chip, and a signal processing circuit, and includes, as the sensor chip, the sensor chip according to the embodiment of the present disclosure described above.

A distance measurement apparatus according to an embodiment of the present disclosure includes an optical system, a sensor chip, and a signal processing circuit that calculates a distance from an output signal of the sensor chip to a measurement target, and includes, as the sensor chip, the sensor chip according to the embodiment of the present disclosure described above.

In the sensor chip according to the embodiment of the present disclosure, the electronic apparatus according to the embodiment, and the distance measurement apparatus according to the embodiment, the light collector is provided between the photoelectric converter and the light reflector to thereby collect the light passing through the photoelectric converter toward the light reflector.

BRIEF DESCRIPTION OF DRAWINGS

FIG. 1 is a diagram illustrating an example of a cross-sectional configuration of a sensor chip according to an embodiment of the present disclosure.

FIG. 2 is a diagram illustrating an example of a planar configuration of a diffractive lens of the sensor chip illustrated in FIG. 1.

FIG. 3 is a diagram illustrating an example of a cross-sectional configuration of a sensor chip according to Modification A.

FIG. 4 is a diagram illustrating an example of a cross-sectional configuration of a sensor chip according to Modification B.

FIG. 5 is a diagram illustrating an example of a cross-sectional configuration of a sensor chip according to Modification C.

FIG. 6 is a diagram illustrating an example of a cross-sectional configuration of a sensor chip according to Modification D.

FIG. 7 is a diagram illustrating an example of a cross-sectional configuration of a sensor chip according to Modification E.

FIG. 8 is a diagram illustrating an example of a planar configuration of a contact layer of the sensor chip illustrated in FIG. 7.

FIG. 9 is a diagram illustrating an example of a cross-sectional configuration of a sensor chip according to Modification F.

FIG. 10 is a diagram illustrating an example of a cross-sectional configuration of a sensor chip according to Modification G.

FIG. 11 is a diagram illustrating an example of a cross-sectional configuration of a sensor chip according to Modification H.

FIG. 12 is a diagram illustrating an example of a cross-sectional configuration of a sensor chip according to Modification I.

FIG. 13 is a diagram illustrating an example of a cross-sectional configuration of a sensor chip according to Modification J.

FIG. 14 is a block diagram illustrating an example of a schematic configuration of an electronic apparatus that includes the sensor chip according to any of the embodiment and the modifications thereof described above.

FIG. 15 is a block diagram depicting an example of schematic configuration of a vehicle control system.

FIG. 16 is a diagram of assistance in explaining an example of installation positions of an outside-vehicle information detecting section and an imaging section.

MODES FOR CARRYING OUT THE INVENTION

In the following, an embodiment of the present disclosure is described in detail with reference to the drawings. Note that the description is given in the following order.
1. Embodiment (sensor chip) . . . FIGS. 1 and 2
An example in which a diffractive lens including a stacked body of an insulating film and an electrically conductive film is provided between an SPAD and a light reflection film.
2. Modifications (sensor chip)
  Modification A: An example in which the diffractive lens includes an insulating film buried in a groove of a semiconductor substrate . . . FIG. 3
  Modification B: An example in which the diffractive lens includes an electrically conductive film or an insulating film . . . FIG. 4
  Modification C: An example in which an inner lens is provided between the SPAD and the light reflection film . . . FIG. 5
  Modification D: An example in which the diffractive lens includes a first wiring line . . . FIG. 6
  Modification E: An example in which a contact layer is provided in each first wiring line included in the diffractive lens . . . FIGS. 7 and 8
  Modification F: An example in which a cathode of the SPAD is provided at a middle part of a pixel . . . FIG. 9
  Modification G: An example in which the light reflection film is provided on a second wiring line and opposes a portion, of the pixel, including the middle part of the pixel . . . FIG. 10
  Modification H: An example in which the light reflection film is provided on the first wiring line and opposes a portion, of the pixel, including the middle part of the pixel . . . FIG. 11
  Modification I: An example in which a light entering surface not having concavities and convexities . . . FIG. 12
  Modification J: An example in which no on-chip lens is provided . . . FIG. 13
3. Application Example: An example in which the sensor chip according to any of the embodiment and the modifications thereof described above is applied to an electronic apparatus . . . FIG. 14
4. Practical Application Example: An example in which the sensor chip according to any of the embodiment and the modifications thereof described above is applied to a mobile body . . . FIGS. 15 and 16
5. Other Modifications

1. EMBODIMENT

Configuration Example

FIG. 1 illustrates an example of a cross-sectional configuration of a sensor chip 1 according to an embodiment of the present disclosure. The sensor chip 1 includes a pixel array in which two or more pixels P are disposed in an array. The pixel P corresponds to one specific example of a "pixel" of the present disclosure.

The pixels P each have a structure in which an SPAD 2 and a wiring layer 26 are stacked. The wiring layer 26 includes a light reflection film LR, and a diffractive lens DL is provided between the SPAD 2 and the light reflection film LR. This SPAD 2 corresponds to one specific example of a "photoelectric converter" of the present disclosure. The light reflection film LR corresponds to one specific example of a "light reflector" of the present disclosure. The diffractive lens DL corresponds to one specific example of a "light collector" of the present disclosure.

The sensor chip 1 is a back-illuminated sensor chip that detects light entering from a back surface of a semiconductor substrate 10. The SPAD 2 is provided in the semiconductor substrate 10 and includes a multiplication region MR in which avalanche multiplication of carriers (electrons) is caused by a high electric-field region. The SPAD 2 includes a light entering surface 10A. One surface of the semiconductor substrate 10 corresponds to the light entering surface 10A of the SPAD 2. The light entering surface 10A is a surface obtained as a result of polishing the back surface of the semiconductor substrate 10. The light entering surface 10A is also referred to as the back surface of the semiconductor substrate 10. Further, the other surface (a surface on an opposite side to the light entering surface 10A) of the semiconductor substrate 10 is also referred to as a surface 10C of the semiconductor substrate 10. The light reflection film LR is provided to oppose the surface 10C of the semiconductor substrate 10.

The semiconductor substrate 10 is provided with a pixel separation groove 30 that separates adjacent pixels P. A pixel separation film TI is buried in the pixel separation groove 30. The pixel separation film TI has, for example, a stacked structure of an insulating film 31 and a light-blocking metal film 32. The insulating film 31 includes a silicon oxide ($SiO_2$), a tantalum oxide ($Ta_2O_5$), a hafnium oxide ($HfO_2$), an aluminum oxide ($Al_2O_3$), etc. The metal film 32 includes tungsten (W), aluminum (Al), etc. Further, a void V is provided inside the metal film 32. Thus, the adjacent pixels P are electrically and optically separated from each other. Note that the void V inside the metal film 32 does not have to be provided.

The SPAD 2 provided in the semiconductor substrate 10 is described. A well layer 11 is provided in a region, of the semiconductor substrate 10, separated by the pixel separation film TI. Inside the well layer 11, a p-type semiconductor region 14 on the light entering surface 10A side and an n-type semiconductor region 15 on the surface 10C side of the semiconductor substrate 10 are provided in such a manner as to provide a p-n junction. A cathode 16 is provided in such a manner as to run through from the n-type semiconductor region 15 to the surface 10C side of the semiconductor substrate 10. Further, a pinning layer 12 is provided between a side surface of the well layer 11 and the pixel separation film TI. The pinning layer 12 is a p-type semiconductor region. An anode 13 is provided at an end of the pinning layer 12 on the surface 10C side of the semiconductor substrate 10. The anode 13 is a p-type semiconductor region.

The semiconductor substrate 10 includes, for example, silicon (Si). The well layer 11 may be an n-type semiconductor region or a p-type semiconductor region. The well layer 11 is preferably an n-type or p-type semiconductor region having a low concentration of about $1 \times 10^{14}$ atoms/$cm^{-3}$ or less, for example. This makes it easier to deplete the well layer 11, making it possible to improve PDE of the SPAD 2.

The p-type semiconductor region 14 is a p-type semiconductor region (p+) having a high impurity concentration.

The n-type semiconductor region 15 is an n-type semiconductor region (n+) having a high impurity concentration.

The cathode 16 is an n-type semiconductor region (n++) having a high impurity concentration. The cathode 16 is coupled to the n-type semiconductor region 15 and is provided to be able to apply a predetermined bias to the n-type semiconductor region 15.

The pinning layer 12 is a p-type semiconductor region (p). The pinning layer 12 is provided in such a manner as to surround the side surface of the well layer 11 along the pixel separation film TI. The pinning layer 12 accumulates holes. The anode 13 is coupled to the pinning layer 12, and bias adjustment thereof is allowed to be performed from the anode 13. This enhances the hole concentration of the pinning layer 12, making the pinning stronger. Accordingly, it is possible to suppress generation of a dark current generated at an interface between the pixel separation film TI and the well layer 11, for example. The pinning layer 12 may have, for example, a structure in which the p-type semiconductor region (p+) and the p-type semiconductor region (p) are stacked in this order as viewed from the pixel separation film TI.

The anode 13 is a p-type semiconductor region (p++) having a high impurity concentration. The anode 13 is coupled to the pinning layer 12 and is provided to be able to apply a predetermined bias to the pinning layer 12.

The SPAD 2 is configured in such a manner that application of a predetermined reverse voltage to the p-n junction caused by application of a high negative voltage to the anode 13 results in spreading of the depletion layer from the p-n junction of the p-type semiconductor region 14 and the n-type semiconductor region 15, thereby forming a high electric-field region. When the high electric-field region is formed, the multiplication region MR that allows for avalanche multiplication of carriers is formed. Owing to the avalanche multiplication occurring in the multiplication region MR, the SPAD 2 is able to multiply carriers generated by a single photon entering from the light entering surface 10A and detect the multiplied carriers. The SPAD 2 is configured as described above.

A second concave-convex section 10D is provided on the surface 10C (the surface on the opposite side to the light entering surface 10A) of the semiconductor substrate 10 (a first concave-convex section 10B will be described later). The second concave-convex section 10D includes a stacked body of an insulating film 20 and an electrically conductive film 21. For example, the insulating film 20 includes a silicon oxide, and the electrically conductive film 21 includes polysilicon. The insulating film 20 and the electrically conductive film 21 are provided by the same layers as a gate insulating film and a gate electrode of a MOS (Metal-Oxide-Semiconductor) transistor provided in the semiconductor substrate 10 in a region where the pixel P is not provided, respectively.

FIG. 2 illustrates an example of a planar configuration of a diffractive lens DL of the sensor chip 1. The stacked body of the insulating film 20 and the electrically conductive film 21 provides the second concave-convex section 10D having concavities and convexities provided concentrically and periodically. The second concave-convex section 10D corresponds to one specific example of a "second concave-convex section" of the present disclosure. The second concave-convex section 10D serves as the diffractive lens DL. The diffractive lens DL is an optical member that diffracts light to achieve the same working as a lens. The diffractive lens DL is configured to include fine concavities and convexities having a size of about that of a wavelength of light and provided concentrically and periodically.

As illustrated in FIG. 1, a sidewall insulating film 22 is provided in such a manner as to cover the side wall of the electrically conductive film 21 and the surface 10C of the semiconductor substrate 10. For example, the sidewall insulating film 22 includes a silicon nitride. A passivation insulating film 23 is provided in such a manner as to cover the electrically conductive film 21 and the sidewall insulating film 22. For example, the passivation insulating film 23 includes a silicon oxide.

A wiring layer 26 is provided in such a manner as to cover the passivation insulating film 23. The wiring layer 26 includes two or more stacked wiring lines embedded in an insulating film 24. The two or more wiring lines include, for example, a first wiring line 25B, a second wiring line 25D, and a third wiring line 25F. Note that, although FIG. 1 illustrates an example including three layers of the stacked wiring lines, the number of layers of the stacked wiring lines is not particularly limited. The two or more wiring lines are coupled by a contact layer 25A, a first vertical coupling layer 25C, and a second vertical coupling layer 25E. The first wiring line 25B, the second wiring line 25D, the third wiring line 25F, the contact layer 25A, the first vertical coupling layer 25C, and the second vertical coupling layer 25E each include, for example, a metal film of copper or the like. The insulating film 24 includes, for example, a silicon oxide. Although the insulating film 24 is illustrated as a single layer in the drawing, it is a stacked body of insulating films corresponding to the respective layers of the two or more wiring lines. The contact layer 25A is provided in such a manner as to run through the sidewall insulating film 22 and the passivation insulating film 23 and couple the anode 13 or the cathode 16 to the first wiring line 25B. The two or more wiring lines embedded in the wiring layer 26 are configured to be able to apply respective predetermined biases to the anode 13 and the cathode 16. A part, of the first wiring line 25B, opposing the SPAD 2 serves as the light reflection film LR. The light reflection film LR is configured to reflect light, which has passed through the SPAD 2 and reached the surface 10C side of the semiconductor substrate 10, back toward the SPAD 2. The third wiring line 25F is exposed from the insulating film 24 and serves as a terminal for external coupling.

The first concave-convex section 10B is provided on the back surface (the light entering surface 10A of the SPAD 2) of the semiconductor substrate 10. The first concave-convex section 10B corresponds to one specific example of a "first concave-convex section" of the present disclosure. The first concave-convex section 10B includes, for example, quadrangular pyramidal depressions (inverted pyramidal shapes) arranged in an array. The first concave-convex section 10B diffuses light entering the SPAD 2 by diffracting and scattering it. By diffusing entering light L, it is possible to increase an optical path length in the SPAD 2 to thereby improve PDE. The first concave-convex section 10B is formed, for example, by performing an etching process on the light entering surface 10A of the semiconductor substrate 10.

An inter-pixel light blocking film 33 is provided on the back surface of the semiconductor substrate 10 and is in contact with the pixel separation film TI. The inter-pixel light blocking film 33 includes, for example, light blocking metal such as W or Al. The inter-pixel light blocking film 33 is configured to help to prevent light that has obliquely entered the light entering surface 10A from failing to enter the pixel P to enter and entering another pixel P adjacent thereto.

An anti-reflection film 35 is provided in such a manner as to follow the concavities and convexities of the first concave-convex section 10B and to cover the light entering surface 10A of the SPAD 2. For example, as the anti-reflection film 35, an insulating thin film having a stacked structure in which a fixed charge film and an oxide film are stacked and having a high dielectric constant (High-k) provided by an ALD (Atomic Layer Deposition) method can be used. For example, the anti-reflection film 35 includes a stacked body of a first anti-reflection film 35A, a second anti-reflection film 35B, and a third anti-reflection film 35C. The first anti-reflection film 35A, the second anti-reflection film 35B, and the third anti-reflection film 35C each include, for example, a hafnium oxide, an aluminum oxide, a titanium oxide ($TiO_2$), or a STO (Strontium Titan Oxide). For example, a configuration in which the first anti-reflection film 35A includes a hafnium oxide, the second anti-reflection film 35B includes an aluminum oxide, and the third anti-reflection film 35C includes a silicon oxide may be used. The second anti-reflection film 35B is provided in the same layer as the insulating film 31 included in the pixel separation film TI. In addition, the third anti-reflection film 35C is provided on the entire surface to cover the inter-pixel light blocking film 33.

Further, on the back surface of the semiconductor substrate 10, an on-chip lens 34 is provided in an upper layer of the anti-reflection film 35 in such a manner as to cover the light entering surface 10A. The on-chip lens 34 includes, for example, a light-transmissive material such as a thermoplastic positive photosensitive resin or a silicon nitride. The on-chip lens 34 is configured to collect the entering light L entering the light entering surface 10A toward the multiplication region MR. A protective film 36 is provided on the entire surface in an upper layer of the on-chip lens 34.

[Manufacturing Method]

Next, a process of manufacturing the sensor chip 1 is described. For example, the well layer 11, the pinning layer 12, the anode 13, the p-type semiconductor region 14, the n-type semiconductor region 15, the cathode 16, and the p-type semiconductor region 17 are each formed on the semiconductor substrate 10 by ion implantation. Thereafter, the insulating film 20 and the electrically conductive film 21 are formed on the surface 10C of the semiconductor substrate 10, for example, by a CVD (Chemical Vapor Deposition) method, which are etched into a concentric shape to form the second concave-convex section 10D (the diffractive lens DL). Next, the sidewall insulating film 22 and the passivation insulating film 23 are formed. Thereafter, formation of an insulating film and formation of an electrically conductive film are repeated to form the wiring layer 26. Next, on the back surface of the semiconductor substrate 10, polishing of the semiconductor substrate 10 (formation of the light entering surface 10A), formation of the pixel separation film TI, formation of the first concave-convex section 10B, formation of the anti-reflection film 35, formation of the inter-pixel light blocking film 33, formation of the on-chip lens 34, and formation of the protective film 36 are performed. Thus, the sensor chip 1 is manufactured.

[Operation]

In the sensor chip 1, in the SPAD 2 of each pixel P, a high negative voltage is applied to the anode 13, which by a predetermined reverse voltage is applied to the p-n junction. This causes the depletion layer to spread from the p-n junction of the p-type semiconductor region 14 and the n-type semiconductor region 15, thereby providing a high electric-field region. The obtained high electric-field region provides the multiplication region MR that allows for avalanche multiplication of carriers. The multiplication region MR multiplies carriers generated from a single photon entering from the light entering surface 10A to generate multiplied signal charge. The obtained signal charge is extracted from the SPAD 2 and subjected to a signal process by the signal processing circuit.

The sensor chip 1 is usable as a distance measurement sensor based on a ToF (Time of Flight) method. In the ToF method, a signal delay time between a signal based on the signal charge and a reference signal is converted into a distance to a measurement target. The signal processing circuit calculates, for example, the signal delay time from the signal based on the signal charge obtained from the SPAD 2 of each pixel P and the reference signal. The obtained signal delay time is converted into a distance. Thus, the distance to the measurement target is measured.

Workings and Effects

The sensor chip 1 of the present embodiment includes the diffractive lens DL provided between the SPAD 2 and the light reflection film LR, and is able to collect light that has entered from the light entering surface 10A, passed through the SPAD 2 without being photoelectrically converted, and reached the surface 10C side of the semiconductor substrate 10, toward the light reflection film LR by the diffractive lens DL.

The light reflection film LR is adapted to reflect, in a direction toward the SPAD 2, light that has passed through the SPAD 2 without being photoelectrically converted and reached the surface 10C side of the semiconductor substrate 10. In a case where the diffractive lens DL is not provided, the light reaching the surface 10C side of the semiconductor substrate 10 does not always hit the light reflection film LR, and sometimes escapes from the gap of the light reflection film LR to the outside of the pixel P. This leads to decrease in PDE. Further, entry of the light escaped from the pixel P into another pixel P sometimes has led to occurrence of crosstalk.

The sensor chip 1 of the present embodiment is provided with the diffractive lens DL as described above. Therefore, it is possible to collect the light reaching the surface 10C side of the semiconductor substrate 10 toward the light reflection film LR. This makes it possible to increase light reflected by the light reflection film LR and returning toward the SPAD 2. The returning of the light toward the SPAD 2 increases an opportunity to be photoelectrically converted to thereby make a contribution to PDE. This makes it possible to improve PDE. Further, escape of the light to the outside of the pixel P is suppressed. It is thus possible to suppress crosstalk.

In particular, in a case where the first concave-convex section 10B is provided on the light entering surface 10A, the light entering the SPAD 2 is diffused by the first concave-convex section 10B, making it possible to increase the optical path length in the SPAD 2 to thereby improve PDE. Meanwhile, on the surface 10C side of the semiconductor substrate 10, increase of light not hitting the light reflection film LR has sometimes led to decrease in PDE. In the sensor chip 1, the first concave-convex section 10B is provided on the light entering surface 10A to improve PDE. Further, on the surface 10C side of the semiconductor substrate 10, light is collected toward the light reflection film LR to increase the light reflected toward the SPAD 2. This also makes it possible to improve PDE.

As described above, in the sensor chip 1 of the present embodiment, it is possible to improve PDE in the pixel. Furthermore, escape of the light to the outside of the pixel P is suppressed, making it possible to suppress crosstalk.

2. MODIFICATIONS

In the following, modifications of the sensor chip 1 according to the above-described embodiment are described. Note that, in the following modifications, the same reference numerals are assigned to the configurations common to those in the above-described embodiment.

Modification A

In the above-described sensor chip 1, the second concave-convex section 10D (the diffractive lens DL) has a configuration including the stacked body of the insulating film 20 and the electrically conductive film 21. However, the present disclosure is not limited thereto. The second concave-convex section 10D (the diffractive lens DL) may have a configuration including an insulating film 27B buried in a groove 27A provided on a surface (the surface 10C of the semiconductor substrate 10), of the SPAD 2, on an opposite side to the light entering surface 10A.

FIG. 3 illustrates an example of a cross-sectional configuration of the pixel P of a sensor chip 1A as Modification A. The groove 27A is provided on the surface (the surface 10C of the semiconductor substrate 10), of the SPAD 2, on the opposite side to the light entering surface 10A. The insulating film 27B is buried in the groove 27A. For example, the insulating film 27B includes a silicon oxide. The insulating film 27B includes concavities and convexities that are provided concentrically and periodically to provide the second concave-convex sections 10D. The second concave-convex section 10D functions as a diffractive lens DLA. The insulating film 27B buried in the groove 27A is provided by the same layer as an STI (Shallow Trench Isolation) device separation film provided in the semiconductor substrate 10 in a region where the pixel P is not provided. Except for the above, it has a configuration similar to that of the sensor chip 1.

In the pixel P of the sensor chip 1A, as with the sensor chip 1, light that has passed through the SPAD 2 and reached the surface 10C side of the semiconductor substrate 10 is collected by the diffractive lens DL on the light reflection film LR and is reflected by the light reflection film LR toward the SPAD 2. It is thereby possible to improve PDE. Furthermore, escape of the light to the outside of the pixel P is suppressed, making it possible to suppress crosstalk. Further, it is possible to achieve the diffractive lens DL without the sidewall.

Modification B

In the above-described sensor chip 1, the second concave-convex section 10D (the diffractive lens DL) has a configuration including the stacked body of the insulating film 20 and the electrically conductive film 21. However, the present disclosure is not limited thereto. The second concave-convex section 10D (the diffractive lens DL) may have a configuration including an electrically conductive film 28 provided on a surface (the surface 10C of the semiconductor substrate 10), of the SPAD 2, on the opposite side to the light entering surface 10A.

FIG. 4 illustrates an example of a cross-sectional configuration of the pixel P of a sensor chip 1B as Modification B. The electrically conductive film 28 is provided on the surface (the surface 10C of the semiconductor substrate 10), of the SPAD 2, on the opposite side to the light entering surface 10A with the sidewall insulating film 22 and the passivation insulating film 23 therebetween. The sidewall insulating film 22 is the same layer as the sidewall insulating film provided on the sidewall of the gate electrode of the transistor in an unillustrated region of the semiconductor substrate 10. For example, the electrically conductive film 28 includes polysilicon. The electrically conductive film 28 includes concavities and convexities that are provided concentrically and periodically to provide the second concave-convex section 10D. The second concave-convex section 10D functions as a diffractive lens DLB. The electrically conductive film 28 is provided by the same layer as a film provided as a wiring line in a region where the pixel P is not provided. Except for the above, it has a configuration similar to that of the sensor chip 1.

In the pixel P of the sensor chip 1B, as with the sensor chip 1, light that has passed through the SPAD 2 and reached the surface 10C side of the semiconductor substrate 10 is collected by the diffractive lens DLB on the light reflection film LR and is reflected by the light reflection film LR toward the SPAD 2. It is thereby possible to improve PDE. Furthermore, escape of the light to the outside of the pixel P is suppressed, making it possible to suppress crosstalk. Further, it is possible to achieve the diffractive lens DL without the sidewall.

The film included in the second concave-convex section 10D is not limited to the electrically conductive film 28. It is possible to obtain effects similar to those described above also in a case where the film included in the second concave-convex section 10D includes an insulating film of a silicon oxide, a silicon nitride, or the like. In addition, the electrically conductive film 28 or an insulating film included in the second concave-convex section 10D may be a multi-layered film.

Modification C

The above-described sensor chip 1 has a configuration in which the diffractive lens DL is provided between the SPAD 2 and the light reflection film LR. However, the present disclosure is not limited thereto. A configuration in which an inner lens IL is provided instead of the diffractive lens DL may be provided.

FIG. 5 illustrates an example of a cross-sectional configuration of the pixel P of a sensor chip 1C as Modification C. The inner lens IL is provided between the SPAD 2 and the light reflection film LR. The inner lens IL includes, for example, a material having a refractive index higher than that of a silicon oxide. FIG. 5 illustrates that the inner lens IL has a shape protruding in a direction from the light reflection film LR toward the SPAD 2. However, this is non-limiting. For example, the inner lens IL may have a shape protruding in a direction from the SPAD 2 toward the light reflection film LR. Except for the above, it has a configuration similar to that of the sensor chip 1.

In the pixel P of the sensor chip 1C, as with the sensor chip 1, light that has passed through the SPAD 2 and reached the surface 10C side of the semiconductor substrate 10 is collected by the inner lens IL on the light reflection film LR, and is reflected by the light reflection film LR toward the SPAD 2. It is thereby possible to improve PDE. Furthermore, escape of the light to the outside of the pixel P is suppressed, making it possible to suppress crosstalk.

Modification D

In the above-described sensor chip 1, the second concave-convex section 10D (the diffractive lens DL) has a configuration including the stacked body of the insulating film 20 and the electrically conductive film 21. However, the present disclosure is not limited thereto. The second concave-convex section 10D (the diffractive lens DL) may include an electrically conductive film in the same layer as one of the layers of the two or more wiring lines embedded in the wiring layer 26.

FIG. 6 illustrates an example of a cross-sectional configuration of the pixel P of the sensor chip 1D as Modification D. Two or more stacked wiring lines are embedded in the wiring layer 26. The two or more wiring layers include, for example, the first wiring line 25B, the second wiring line 25D, the third wiring line 25F, and a fourth wiring line 25H. Note that, although FIG. 6 illustrates an example including the wiring lines of four stacked layers, the number of the stacked layers of the wiring lines is not particularly limited. These wiring lines are coupled by the contact layer 25A, the first vertical coupling layer 25C, the second vertical coupling layer 25E, and a third vertical coupling layer 25G. The first wiring line 25B, the second wiring line 25D, the third wiring line 25F, the fourth wiring line 25H, the contact layer 25A, the first vertical coupling layer 25C, the second vertical coupling layer 25E, and the third vertical coupling layer 25G each include, for example, a metal film of copper or the like. The second concave-convex section 10D is provided on the electrically conductive film of the same layer as the first wiring line 25B to provide a diffractive lens DLC. This first wiring line 25B is a layer closest to the SPAD 2 of the stacked wiring lines. Further, a part, of the second wiring line 25D, opposing the SPAD 2 is included in the light reflection film LR. The third wiring line 25F is provided inside the insulating film 24. The fourth wiring line 25H is exposed from the insulating film 24, and serves as a terminal for external coupling. Except for the above, it has a configuration similar to that of the sensor chip 1.

In the pixel P of the sensor chip 1D, as with the sensor chip 1, light that has passed through the SPAD 2 and reached the surface 10C side of the semiconductor substrate 10 is collected by the diffractive lens DLC on the light reflection film LR, and is reflected by the light reflection film LR toward the SPAD 2. It is thereby possible to improve PDE. Furthermore, escape of the light to the outside of the pixel P is suppressed, making it possible to suppress crosstalk. Changing the layout shape of the two or more wiring lines embedded in the wiring layer 26 makes it possible to achieve a structure including the diffractive lens DL and the light reflection film LR.

Modification E

The above-described sensor chip 1D has a configuration in which the second concave-convex section 10D (the diffractive lens DLC) is provided in the layer (the first wiring line 25B) closest to the SPAD 2 of the stacked wiring lines. However, the present disclosure is not limited thereto. The contact layer 25A may be provided between each of the first wiring lines 25B included in the concentric second concave-convex section 10D and the SPAD 2.

FIG. 7 illustrates an example of a cross-sectional configuration of the pixel P of a sensor chip 1E as Modification E. A configuration of the two or more stacked wiring lines embedded in the wiring layer 26 is similar to that of the sensor chip 1D. In the sensor chip 1E, the contact layer 25A is provided between each of the first wiring lines 25B included in the concentric second concave-convex section 10D and the SPAD 2.

A planar configuration of the second concave-convex sections 10D including the first wiring lines 25B is similar to that illustrated in FIG. 2, and they are provided concentrically and periodically. FIG. 8 illustrates an example of a planar configuration of the contact layers 25A of the sensor chip 1E. The contact layer 25A is provided between each of the first wiring lines 25B included in the concentric second concave-convex sections 10D and the SPAD 2. The contact layers 25A are provided, for example, in a dot-shaped layout shape illustrated in FIG. 8. The contact layers 25A in the dot shape each overlap any of the concentric second concave-convex sections 10D. That is, the contact layers 25A are each provided in such a manner as to be coupled to any of the second concave-convex sections 10D. Except for the above, it has a configuration similar to that of the sensor chip 1D. Note that the contact layers 25A are not limited to the dot-shaped layout illustrated in FIG. 8. For example, the contact layers 25A may have a concentric layout shape as with the second concave-convex sections 10D. Alternatively, they may have a liner layout shape.

In the pixel P of the sensor chip 1E, as with the sensor chip 1D, light that has passed through the SPAD 2 and reached the surface 10C side of the semiconductor substrate 10 is collected by the diffractive lens DLC on the light reflection film LR and is reflected by the light reflection film LR toward the SPAD 2. It is thereby possible to improve PDE. Furthermore, escape of the light to the outside of the pixel P is suppressed, making it possible to suppress crosstalk. Changing the layout shape of the two or more wiring lines embedded in the wiring layer makes it possible to provide the diffractive lens DL and the light reflection film LR. The contact layers 25A are so provided as to be coupled to the respective concentric first wiring lines 25B. Therefore, it is possible to change the position of the cathode 16 in a range that allows for coupling to the contact layer 25A. This increases a degree of freedom in design. In a case where the cathode 16 is coupled to the first wiring line 25B that is not the outermost one of the concentric first wiring lines 25B, the layout shape of the second wiring line 25D and the wiring lines in its upper layers is selected so as to allow for coupling to the first wiring line 25B to which the cathode 16 is coupled. In this case, it is possible to reduce the size of the light reflection film LR as will be described later in Modification G. It is thereby possible to reduce a pixel capacity.

In the sensor chip 1E, the second concave-convex section 10D includes an electrically conductive layer in the same layer as the first wiring line 25B. However, the second concave-convex section 10D may include an electrically conductive film in the same layer as the layer (the second wiring line 25D and the wiring lines in its upper layers) that is not the layer closest to the SPAD 2 of the wiring lines.

Modification F

The above-described sensor chip 1E has a configuration in which the cathode 16 is provided at a position closer to an end than a middle part of the pixel P. However, the present disclosure is not limited thereto. The cathode 16 may be provided at the middle part of the pixel P in a direction parallel to the light entering surface 10A.

FIG. 9 illustrates an example of a cross-sectional configuration of the pixel P of a sensor chip 1F as Modification F. The second concave-convex section 10D includes the stacked body of the insulating film 20 and the electrically conductive film 21. The cathode 16 is provided at the middle part of the pixel P in the direction parallel to the light entering surface 10A, and the contact layer 25A and the first wiring line 25B are provided in such a manner as to be coupled to the cathode 16. The light reflection film LR includes an electrically conductive film of the same layer as the second wiring line 25D. Except for the above, it has a configuration similar to that of the sensor chip 1E.

In the pixel P of the sensor chip 1F, as with the sensor chip 1E, light that has passed through the SPAD 2 and reached the surface 10C side of the semiconductor substrate 10 is collected by the diffractive lens DL on the light reflection film LR and is reflected by the light reflection film LR toward the SPAD 2. It is thereby possible to improve PDE. Furthermore, escape of the light to the outside of the pixel P is suppressed, making it possible to suppress crosstalk.

Modification G

The above-described sensor chip 1F has a configuration in which the light reflection film LR is provided to oppose the substantially entire region of the pixel P in the direction parallel to the light entering surface 10A. However, the present disclosure is not limited thereto. It may have a configuration in which the light reflection film LR is provided to oppose a portion of the pixel P including the middle part in the direction parallel to the light entering surface 10A.

FIG. 10 illustrates an example of a cross-sectional configuration of the pixel P of a sensor chip 1G as Modification G. The light reflection film LR includes an electrically conductive layer of the same layer as the second wiring line 25D, and is provided to oppose a portion of the pixel P including the middle part in the direction parallel to the light entering surface 10A. That is, the area extending in the direction parallel to the light entering surface 10A is smaller than that of the light reflection film LR having the configuration of being provided to oppose the substantially entire region of the pixel as illustrated in FIG. 9. Except for the above, it has a configuration similar to that of the sensor chip 1F.

In the pixel P of the sensor chip 1G, as with the sensor chip 1F, light that has passed through the SPAD 2 and reached the surface 10C side of the semiconductor substrate 10 is collected by the diffractive lens DL on the light reflection film LR and is reflected by the light reflection film LR toward the SPAD 2. It is thereby possible to improve PDE. Furthermore, escape of the light to the outside of the pixel P is suppressed, making it possible to suppress crosstalk. Reducing the size of the light reflection film LR makes it possible to reduce a pixel capacity.

Modification H

In the above-described sensor chip 1G, the two or more wiring lines embedded in the wiring layer 26 are a stacked body of four layer of wiring lines. However, the present disclosure is not limited thereto. The two or more wiring lines embedded in the wiring layer 26 may include three or less layers.

FIG. 11 illustrates an example of a cross-sectional configuration of the pixel P of the sensor chip 1H as Modification H. The two or more wiring lines embedded in the wiring layer 26 are a stacked body of three layers including the first wiring line 25B, the second wiring line 25D, and the third wiring line 25F. These wiring lines are coupled by the contact layer 25A, the first vertical coupling layer 25C, and the second vertical coupling layer 25E. The light reflection film LR includes an electrically conductive layer of the same layer as the first wiring line 25B, and is provided to oppose a portion of the pixel P including the middle part in the direction parallel to the light entering surface 10A. Except for the above, it has a configuration similar to that of the sensor chip 1G.

In the pixel P of the sensor chip 1H, as with the sensor chip 1G, light that has passed through the SPAD 2 and reached the surface 10C side of the semiconductor substrate 10 is collected by the diffractive lens DL on the light reflection film LR and is reflected by the light reflection film LR toward the SPAD 2. It is thereby possible to improve PDE. Furthermore, escape of the light to the outside of the pixel P is suppressed, making it possible to suppress crosstalk. Decrease in the number of layers of the wiring lines embedded in the wiring layer 26 in addition to the reduction of the size of the light reflection film LR makes it possible to reduce a pixel capacity.

Modification I

In the above-described sensor chip 1, the first concave-convex section 10B is provided on the light entering surface 10A of the SPAD 2. However, the present disclosure is not limited thereto. The light entering surface 10A may be a flat surface.

FIG. 12 illustrates an example of a cross-sectional configuration of the pixel P of a sensor chip 1I as Modification I. The light entering surface 10A of the SPAD 2 is a flat surface. The anti-reflection film 35 covering the light entering surface 10A is also formed to be flat. Except for the above, it has a configuration similar to that of the sensor chip 1.

In the pixel P of the sensor chip 1I, as with the sensor chip 1, light that has passed through the SPAD 2 and reached the surface 10C side of the semiconductor substrate 10 is collected by the diffractive lens DL on the light reflection film LR and is reflected by the light reflection film LR toward the SPAD 2. It is thereby possible to improve PDE. Furthermore, escape of the light to the outside of the pixel P is suppressed, making it possible to suppress crosstalk. Although scattering of light by the first concave-convex section 10B does not occur, it is possible to obtain similar effects in terms of contribution to sensitivity by returning, to the SPAD 2 side, the light that has passed through the SPAD 2 and reached the surface 10C side of the semiconductor substrate 10.

Modification J

In the above-described sensor chip 1I, the on-chip lens 34 is provided to oppose the light entering surface 10A of the SPAD 2. However, the present disclosure is not limited thereto. A configuration without the on-chip lens 34 may be provided.

FIG. 13 illustrates an example of a cross-sectional configuration of the pixel P of a sensor chip 1J as Modification J. The light entering surface 10A of the SPAD 2 is a flat surface, and the anti-reflection film 35 provided to cover the light entering surface 10A also has a flat surface. No on-ship lens 34 is provided on the light entering surface 10A. Except for the above, it has a configuration similar to that of the sensor chip 1.

In the pixel P of the sensor chip 1J, as with the sensor chip 1I, light that has passed through the SPAD 2 and reached the surface 10C side of the semiconductor substrate 10 is collected by the diffractive lens DL on the light reflection film LR, and is reflected by the light reflection film LR toward the SPAD 2. It is thereby possible to improve PDE. Furthermore, escape of the light to the outside of the pixel P is suppressed, making it possible to suppress crosstalk. Although scattering of light by the first concave-convex section 10B does not occur, it is possible to obtain similar effects in terms of contribution to sensitivity by returning, to the SPAD 2 side, the light that has passed through the SPAD 2 and reached the surface 10C side of the semiconductor substrate 10. In particular, because no on-chip lens 34 is provided, the amount of light passing through the SPAD 2 and reaching the surface 10C side of the semiconductor substrate 10 increases. This enhances the effect of improving PDE by collecting the light on the light reflection film LR by the diffractive lens DL and reflecting it toward the SPAD 2 by the light reflection film LR.

3. APPLICATION EXAMPLE

The sensor chips 1 and 1A to 1J described above (represented by the sensor chip 1) are applicable to, for example, various electronic apparatuses including a camera such as a digital still camera or a digital video camera, a mobile phone having an imaging function, or any other device having an imaging function.

FIG. 14 is a block diagram illustrating an example of a schematic configuration of an electronic apparatus including the sensor chip 1 according to any of the embodiment and the modifications thereof described above.

An electronic apparatus 201 illustrated in FIG. 14 includes an optical system 202, a shutter device 203, the sensor chip 1, a drive circuit 205, a signal processing circuit 206, a monitor 207, and a memory 208, and is able to perform imaging of a still image and a moving image.

The optical system 202 includes one or more lenses. The optical system 202 guides light (entering light) from a subject to the sensor chip 1 to form an image on a light receiving surface of the sensor chip 1.

The shutter device 203 is disposed between the optical system 202 and the sensor chip 1. The shutter device 203 controls a period of applying light to the sensor chip 1 and a period of blocking the light in accordance with a control by the drive circuit 205.

The sensor chip 1 includes a package including the sensor chip described above. The sensor chip 1 generates signal charge in accordance with light formed into an image on the light receiving surface via the optical system 202 and the shutter device 203. The signal charge generated in the sensor chip 1 is supplied to the signal processing circuit 206.

The signal processing circuit 206 performs various signal processes on the signal charge supplied from the sensor chip 1. An image (image data) obtained as a result of the signal process performed by the signal processing circuit 206 is supplied to the monitor 207 to be displayed, or is supplied to the memory 208 to be stored (recorded).

Application of the sensor chip 1 allows the electronic apparatus 201 configured as described above to improve PDE and to thereby obtain a high-definition imaging image.

4. PRACTICAL APPLICATION EXAMPLE

The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

FIG. 15 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 15, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 15, an audio speaker 12061, a display section 12062, and an instrument panel 12063 are illustrated as the output device. The display section 12062 may, for example, include at least one of an on-board display and a head-up display.

FIG. 16 is a diagram depicting an example of the installation position of the imaging section 12031.

In FIG. 16, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 16 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above has described the example of the mobile body control system to which the technology according to the present disclosure is applicable. The technology according to the present disclosure is applicable to the imaging section 12031 among the above-described components. Specifically, the sensor chip 1 according to any of the embodiment and the modifications thereof described above is applicable to the imaging section 12031. The application of the technology according to the present disclosure to the imaging section 12031 makes it possible to improve PDE and to thereby obtain a high-definition imaging image. It is therefore possible to perform a highly accurate control utilizing an imaging image in the mobile body control system.

5. OTHER MODIFICATIONS

The present disclosure has been described above with reference to the embodiment, the modifications A to J thereof, the application example, and the practical application example. However, the present disclosure is not limited to the embodiment and the like described above, and is modifiable in a variety of ways.

The sensor chip of any of the embodiment and the modifications thereof described above is applicable to a distance measurement apparatus that calculates a distance from an output signal of the sensor chip to a measurement target. In this case, the distance measurement apparatus includes a signal processing circuit that calculates the distance from the output signal of the sensor chip to the measurement target.

Further, in the sensor chip of any of the embodiment and the modifications described above, a light collection section such as a diffractive lens or an inner lens does not have to be provided outside an effective pixel region, for example, in an ineffective pixel in which light is blocked by a light blocking film or in a pixel peripheral section. In the case of providing a pixel array, the number of pixels is not particularly limited. Further, the embodiment and the modifications A to J thereof can be appropriately combined.

Further, the SPAD 2 of each of the pixels P of the embodiment and the modifications A to J thereof may have a configuration in which the n-type impurity region and the p-type impurity region are replaced with each other. In this case, the n-type impurity region is provided between the side surface of the well layer 11 and the pixel separation film TI, and a cathode is provided at its end. Further, an n-type impurity region and a p-type impurity region providing a p-n junction are provided inside the well layer 11, and an anode is provided so as to be coupled to this p-type impurity region. Driving of the SPAD having such a configuration is performed by applying a high negative voltage to the anode 13 and thereby applying a predetermined reverse voltage to the p-n junction.

It is to be noted that the effects described herein are merely illustrative. The effects of the present disclosure are not limited to the effects described herein. The present disclosure may have effects other than the effects described herein.

Note that the present technology may have the following configurations. According to the present technology having the following configurations, it is possible to improve PDE.

(1)

A sensor chip including a pixel including a photoelectric converter that includes a light entering surface which light enters and a multiplication region in which avalanche multiplication of carriers is caused by a high electric-field region, a light reflector that is provided to oppose a surface, of the photoelectric converter, on an opposite side to the light entering surface, and a light collector that is provided between the photoelectric converter and the light reflector.

(2)

The sensor chip according to (1) described above, in which the light collector collects, toward the light reflector, the light passing through the photoelectric converter.

(3)

The sensor chip according to (1) or (2) described above, in which the light entering surface is provided with a first concave-convex section that diffuses the light.

(4)

The sensor chip according to any one of (1) to (3) described above, further including an on-chip lens that is provided to oppose the light entering surface.

(5)

The sensor chip according to any one of (1) to (4) described above, in which the light collector includes a diffractive lens.

(6)

The sensor chip according to (5) described above, in which the diffractive lens includes second concave-convex sections that are provided concentrically and periodically.

(7)

The sensor chip according to (6) described above, in which the second concave-convex section includes an electrically conductive film.

(8)

The sensor chip according to (6) described above, in which the second concave-convex section includes a stacked body of an insulating film and an electrically conductive film.

(9)

The sensor chip according to (6) described above, in which the second concave-convex section includes an insulating film.

(10)

The sensor chip according to (9) described above, in which the insulating film is buried in a groove provided on the surface, of the photoelectric converter, on the opposite side to the light entering surface.

(11)

The sensor chip according to (6) described above, in which
  a wiring layer is provided on the surface, of the photoelectric converter, on the opposite side to the light entering surface, the wiring layer including two or more stacked wiring lines that are embedded in an insulating film, and
  the second concave-convex section includes an electrically conductive film in the same layer as one of the two or more wiring lines.

(12)

The sensor chip according to (11) described above, in which a contact section is provided between each of the electrically conductive films included in the second concave-convex sections provided concentrically and the photoelectric converter.

(13)

The sensor chip according to (11) or (12) described above, in which the second concave-convex section includes an electrically conductive film in the same layer as a layer, of the two or more wiring lines, closest to the photoelectric converter.

(14)

The sensor chip according to (11) or (12) described above, in which the second concave-convex section includes an electrically conductive film in the same layer as a layer that is other than a layer, of the two or more wiring lines, closest to the photoelectric converter.

(15)

The sensor chip according to (6) described above, in which
  a wiring layer is provided on the surface, of the photoelectric converter, on the opposite side to the light entering surface, the wiring layer including two or more stacked wiring lines that are embedded in an insulating film, and
  the two or more wiring lines are provided to be coupled to a cathode of the photoelectric converter at a middle part of the pixel in a direction parallel to the light entering surface.

(16)

The sensor chip according to any one of (1) to (15) described above, in which the light reflector is provided to oppose a portion of the pixel including a middle part of the pixel in a direction parallel to the light entering surface.

(17)

The sensor chip according to any one of (1) to (4) described above, in which the light collector includes an inner lens.

(18)

An electronic apparatus including:
  an optical system;
  a sensor chip; and
  a signal processing circuit, in which
  the sensor chip includes a pixel including
    a photoelectric converter that includes a light entering surface which light enters and a multiplication region in which avalanche multiplication of carriers is caused by a high electric-field region,
    a light reflector that is provided to oppose a surface, of the photoelectric converter, on an opposite side to the light entering surface, and
    a light collector that is provided between the photoelectric converter and the light reflector.

(19)

A distance measurement apparatus including:
  an optical system;
  a sensor chip; and
  a signal processing circuit that calculates a distance from an output signal of the sensor chip to a measurement target, in which
  the sensor chip includes a pixel including
    a photoelectric converter that includes a light entering surface which light enters and a multiplication region in which avalanche multiplication of carriers is caused by a high electric-field region,
    a light reflector that is provided to oppose a surface, of the photoelectric converter, on an opposite side to the light entering surface, and
    a light collector that is provided between the photoelectric converter and the light reflector.

This application claims the priority on the basis of Japanese Patent Application No. 2019-050885 filed on Mar. 19, 2019 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A sensor chip, comprising:
  a pixel including:
    a photoelectric converter that includes:
      a first surface through which light enters, wherein the first surface corresponds to a light entering surface; and
      a multiplication region configured to cause avalanche multiplication of carriers in a high electric-field region of the pixel;
    a light reflector opposite to the light entering surface; and
    a light collector between the photoelectric converter and the light reflector, wherein
      the light collector includes a diffractive lens,
      the diffractive lens includes a plurality of first concave-convex sections,
      the plurality of first concave-convex sections is concentric and periodic, and
      each of the plurality of first concave-convex sections includes an electrically conductive film.

2. The sensor chip according to claim 1, wherein the light collector is configured to collect, towards the light reflector, the light that passes through the photoelectric converter.

3. The sensor chip according to claim 1, wherein
  the light entering surface includes a second concave-convex section, and
  the second concave-convex section is configured to diffuse the light.

4. The sensor chip according to claim 1, further comprising an on-chip lens opposite to the light entering surface.

5. The sensor chip according to claim 1, wherein
  each of the plurality of first concave-convex sections further includes an insulating film, and
  the insulating film and the electrically conductive film are stacked.

6. The sensor chip according to claim 1, wherein each of the plurality of first concave-convex sections further includes an insulating film.

7. The sensor chip according to claim 6, wherein the insulating film is buried in a groove, wherein the groove is on a second surface of the photoelectric converter, and the second surface is opposite to the first surface.

8. The sensor chip according to claim 1, wherein a wiring layer is on a second surface of the photoelectric converter, the second surface is the opposite to the first surface, the wiring layer includes a plurality of wiring lines, the plurality of wiring lines is embedded in an insulating film, and the electrically conductive film and one of the plurality of wiring lines are in a same layer.

9. The sensor chip according to claim 8, wherein a contact section is between each of the plurality of first concave-convex sections and the photoelectric converter.

10. The sensor chip according to claim 8, wherein the plurality of first concave-convex sections includes the electrically conductive film in a layer of the plurality of wiring lines closest to the photoelectric converter.

11. The sensor chip according to claim 8, wherein the plurality of first concave-convex sections includes the electrically conductive film in a layer that is other than a layer of the plurality of wiring lines closest to the photoelectric converter.

12. The sensor chip according to claim 1, further comprising a wiring layer on a second surface of the photoelectric converter, wherein the second surface is opposite to the first surface, the wiring layer includes a plurality of wiring lines embedded in an insulating film, the plurality of wiring lines are coupled to a cathode of the photoelectric converter, the cathode is at a middle part of the pixel, and the middle part is parallel to the light entering surface.

13. The sensor chip according to claim 1, wherein the light reflector is opposite to a portion of the pixel, the portion includes a middle part of the pixel, and the middle part is parallel to the light entering surface.

14. The sensor chip according to claim 1, wherein the light collector further includes an inner lens.

15. An electronic apparatus, comprising:
an optical system;
a sensor chip; and
a signal processing circuit, wherein
    the sensor chip includes a pixel, and
    the pixel includes:
        a photoelectric converter that includes:
            a first surface through which light enters, wherein the first surface corresponds to a light entering surface; and
            a multiplication region configured to cause avalanche multiplication of carriers in a high electric-field region of the pixel;
        a light reflector opposite to the light entering surface; and
        a light collector between the photoelectric converter and the light reflector, wherein
            the light collector includes a diffractive lens,
            the diffractive lens includes a plurality of first concave-convex sections,
            the plurality of first concave-convex sections is concentric and periodic, and
            each of the plurality of first concave-convex sections includes an electrically conductive film.

16. A distance measurement apparatus, comprising:
an optical system;
a sensor chip; and
a signal processing circuit configured to calculate a distance from an output signal of the sensor chip to a measurement target, wherein
    the sensor chip includes a pixel, and
    the pixel includes:
        a photoelectric converter that includes:
            a first surface through which light enters, wherein the first surface corresponds to a light entering surface; and
            a multiplication region configured to cause avalanche multiplication of carriers in a high electric-field region of the pixel;
    a light reflector opposite to the light entering surface; and
    a light collector between the photoelectric converter and the light reflector, wherein
        the light collector includes a diffractive lens,
        the diffractive lens includes a plurality of first concave-convex sections,
        the plurality of first concave-convex sections is concentric and periodic, and
        each of the plurality of first concave-convex section includes an electrically conductive film.

* * * * *